(12) United States Patent
Chen et al.

(10) Patent No.: US 9,214,387 B2
(45) Date of Patent: *Dec. 15, 2015

(54) SYSTEMS AND METHODS FOR PROVIDING INTRAMODULE RADIO FREQUENCY ISOLATION

(71) Applicant: SKYWORKS SOLUTIONS, INC., Woburn, MA (US)

(72) Inventors: Howard E. Chen, Anaheim, CA (US); Matthew Sean Read, Rancho Santa Margarita, CA (US); Anthony James LoBianco, Irvine, CA (US); Hoang Mong Nguyen, Fountain Valley, CA (US); Guohao Zhang, Nanjing (CN); Dinhphuoc Vu Hoang, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 127 days.

This patent is subject to a terminal disclaimer.

(21) Appl. No.: 14/039,790

(22) Filed: Sep. 27, 2013

(65) Prior Publication Data

US 2014/0175621 A1    Jun. 26, 2014

Related U.S. Application Data

(60) Provisional application No. 61/707,673, filed on Sep. 28, 2012, provisional application No. 61/707,622, filed on Sep. 28, 2012, provisional application No. 61/707,578, filed on Sep. 28, 2012.

(51) Int. Cl.
*H01L 21/768*    (2006.01)
*H01L 23/552*    (2006.01)

(Continued)

(52) U.S. Cl.
CPC .......... *H01L 21/76838* (2013.01); *H01L 21/56* (2013.01); *H01L 21/561* (2013.01);

(Continued)

(58) Field of Classification Search
USPC ...................... 257/528, 690, E23.01, E27.07, 257/E21.705, 659, E21.536; 438/107
See application file for complete search history.

(56) References Cited

U.S. PATENT DOCUMENTS 7,411,278 B2 *   8/2008   Wen et al. ..................... 257/659
8,129,824 B1 *   3/2012   St. Amand et al. ........... 257/659

(Continued)

FOREIGN PATENT DOCUMENTS

| JP | 2004-297456 A | 10/2004 |
| JP | 2009-016715 A | 1/2009 |
| KR | 10-0880800 B1 | 2/2009 |

OTHER PUBLICATIONS

International Search Report and Written Opinion for corresponding application PCT/US2013/062251 dated Jan. 22, 2014.

(Continued)

*Primary Examiner* — Dao H Nguyen
*Assistant Examiner* — Tram H Nguyen
(74) *Attorney, Agent, or Firm* — Fernando Hale & Chang LLP

(57) ABSTRACT

A radio frequency (RF) module comprises RF-shielding structure for providing three-dimensional electromagnetic interference shielding with respect to one or more RF devices disposed on the module. The RF-shielding may comprise wirebond structures disposed adjacent to or surrounding an RF device. Two or more intramodule devices may have wirebond structures configured to at least partially block certain types of RF signals disposed between the devices, thereby reducing effects of cross-talk between the devices.

20 Claims, 31 Drawing Sheets

(51) Int. Cl.
*H01L 23/00* (2006.01)
*H01L 21/56* (2006.01)
*H01L 23/538* (2006.01)

(52) U.S. Cl.
CPC .............. *H01L23/552* (2013.01); *H01L 24/97* (2013.01); *H01L 23/538* (2013.01); *H01L 2224/32225* (2013.01); *H01L 2224/45144* (2013.01); *H01L 2224/48227* (2013.01); *H01L 2224/73265* (2013.01); *H01L 2224/97* (2013.01); *H01L 2924/15192* (2013.01); *H01L 2924/19105* (2013.01); *H01L 2924/19107* (2013.01); *H01L 2924/3025* (2013.01)

(56) References Cited

U.S. PATENT DOCUMENTS

| | | | |
|---|---|---|---|
| 8,948,712 | B2 | 2/2015 | Chen et al. |
| 2007/0071886 | A1 | 3/2007 | Babb et al. |
| 2010/0078779 | A1 | 4/2010 | Barth et al. |
| 2011/0084378 | A1 | 4/2011 | Welch et al. |
| 2011/0089529 | A1* | 4/2011 | Fowlkes et al. ............... 257/528 |
| 2012/0146178 | A1 | 6/2012 | Hoang et al. |
| 2013/0323408 | A1 | 12/2013 | Read et al. |

OTHER PUBLICATIONS

International Preliminary Report on Patentability for corresponding application PCT/US2013/062251 dated Mar. 31, 2015.

* cited by examiner

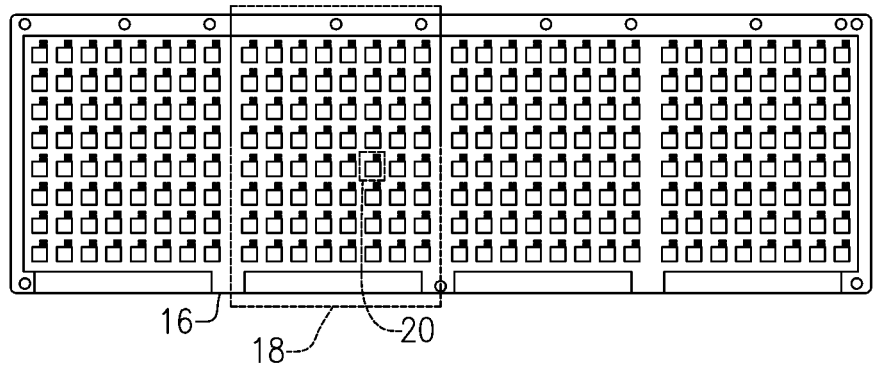
FIG.2A1
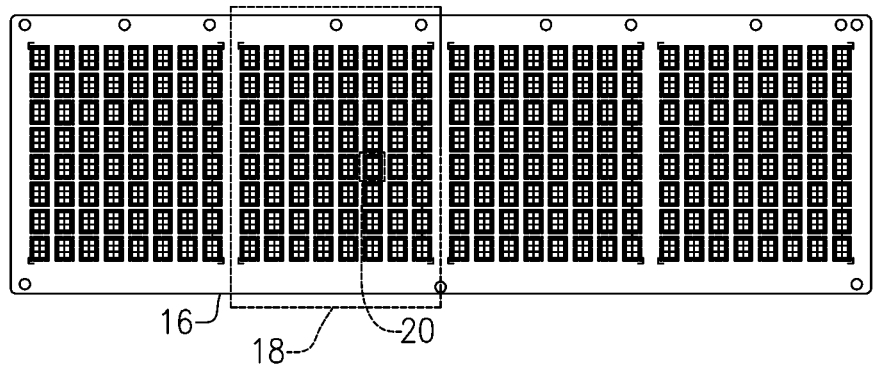
FIG.2A2

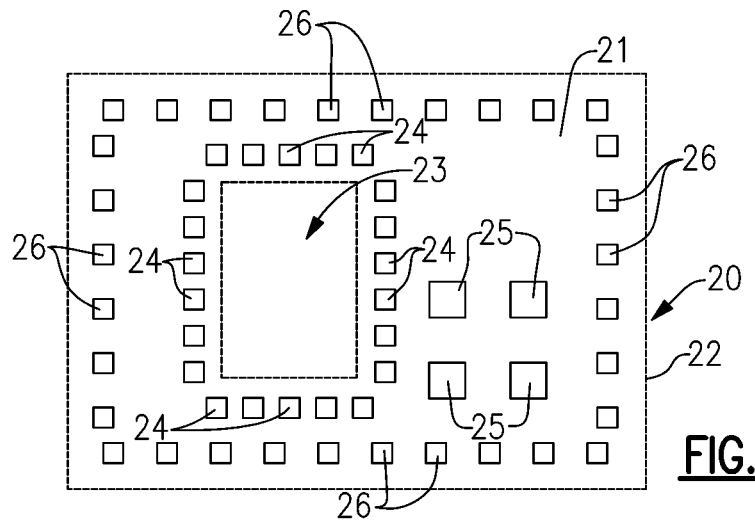
FIG.2B1
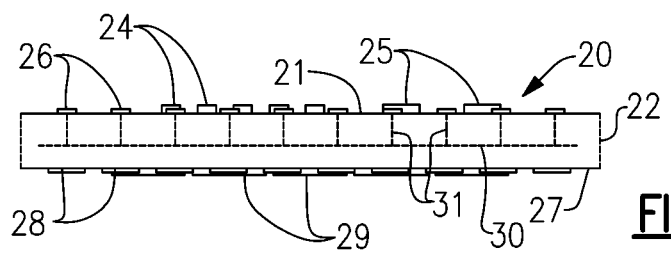
FIG.2B2
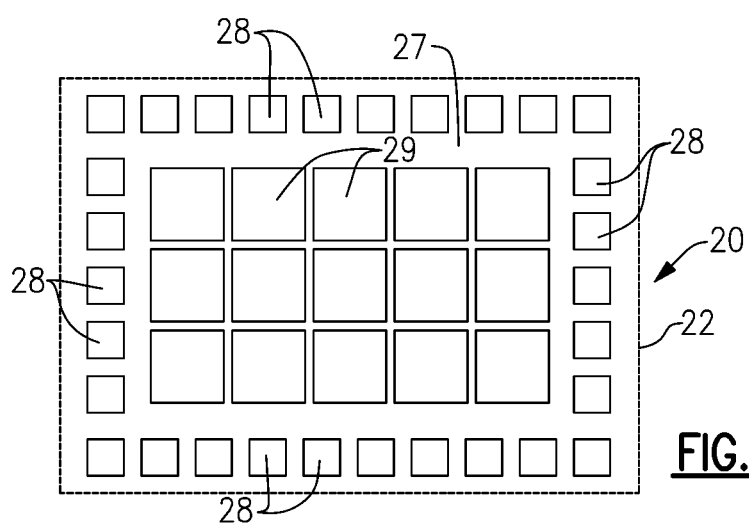
FIG.2B3

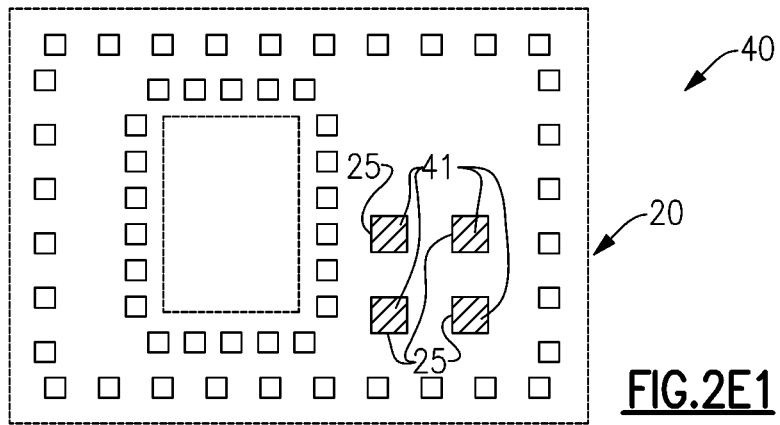
FIG.2E1
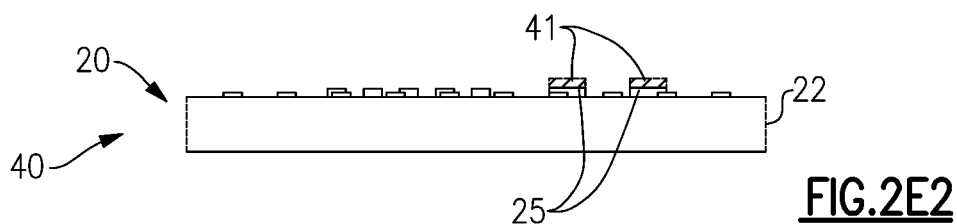
FIG.2E2
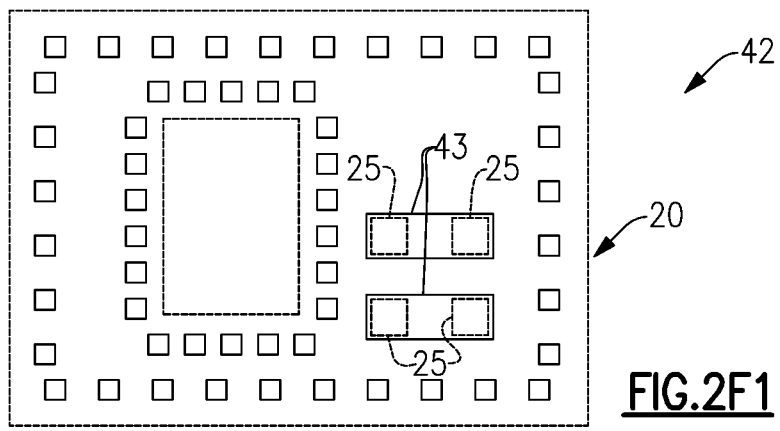
FIG.2F1
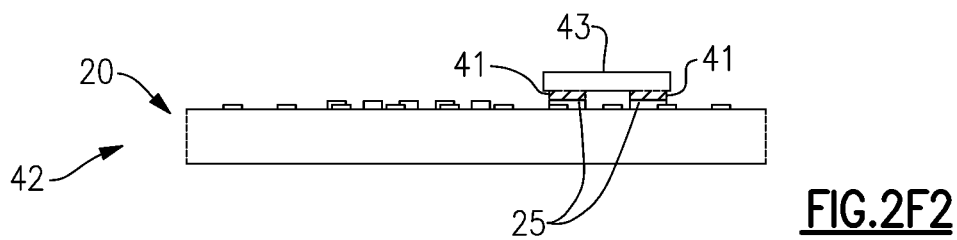
FIG.2F2

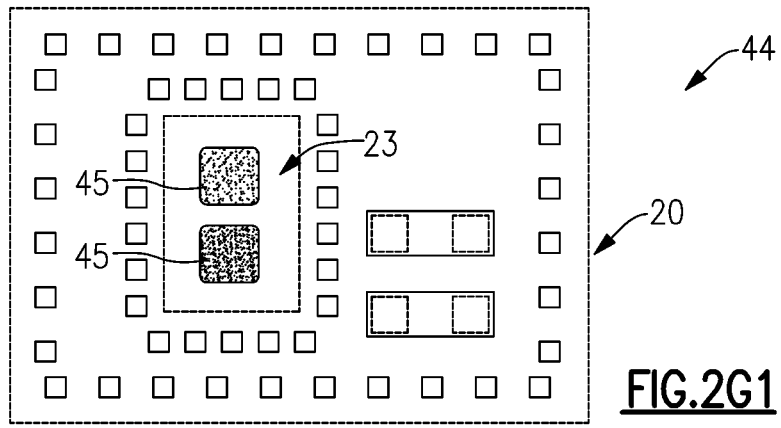
FIG.2G1
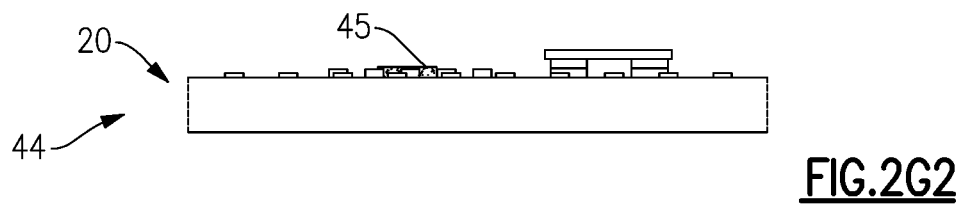
FIG.2G2
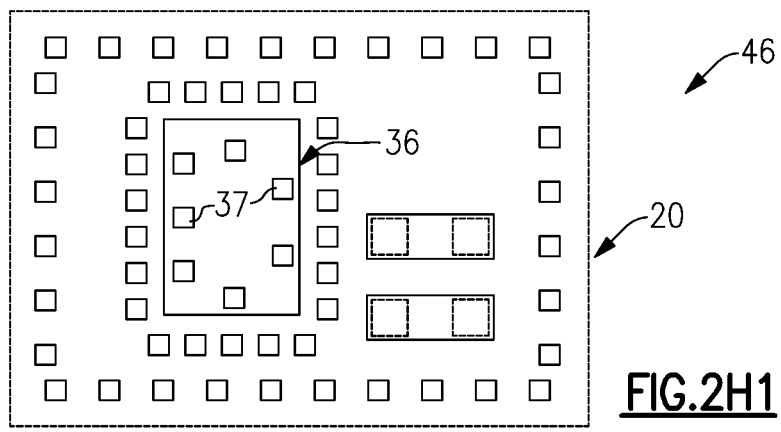
FIG.2H1
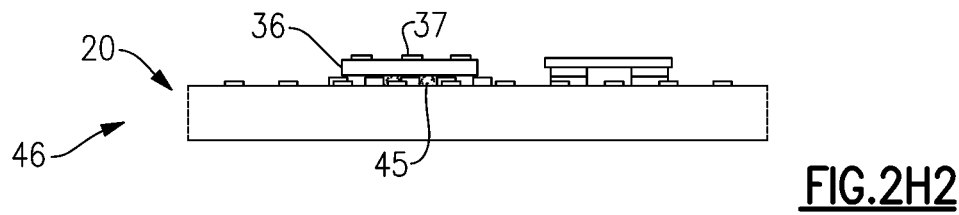
FIG.2H2

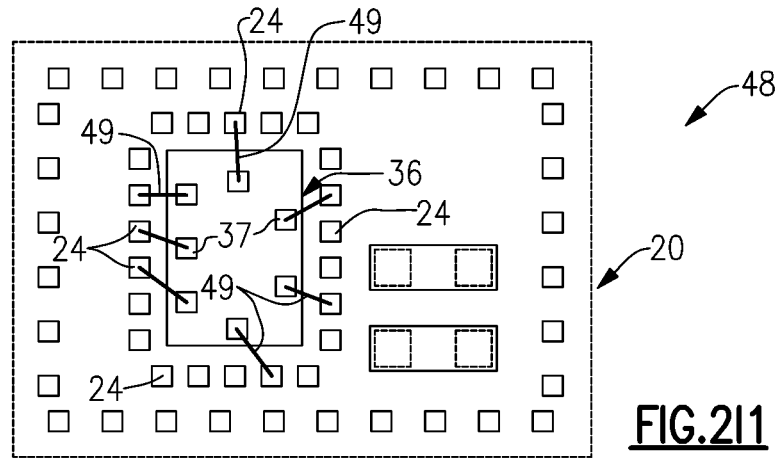
FIG. 2I1
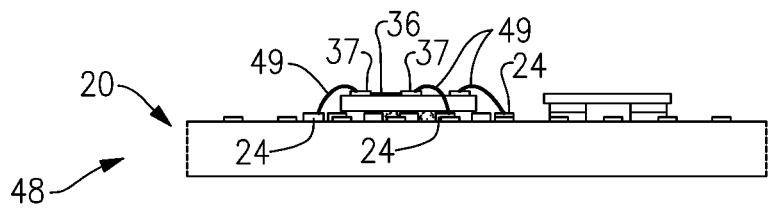
FIG. 2I2
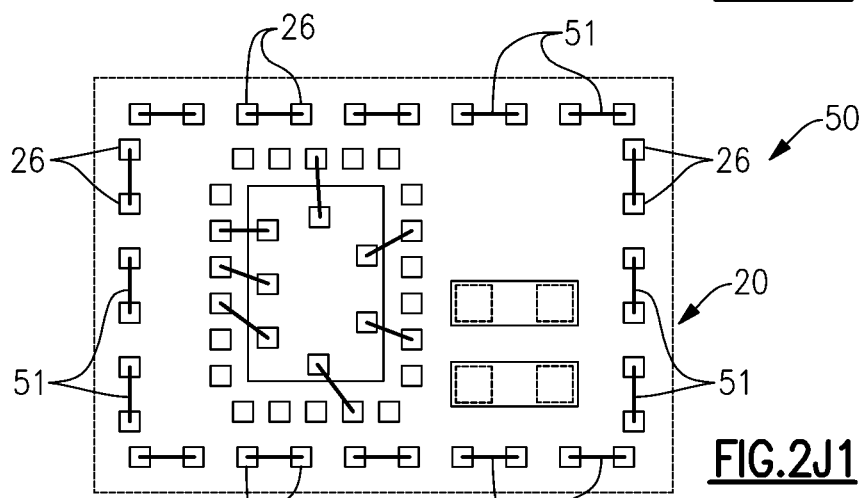
FIG. 2J1
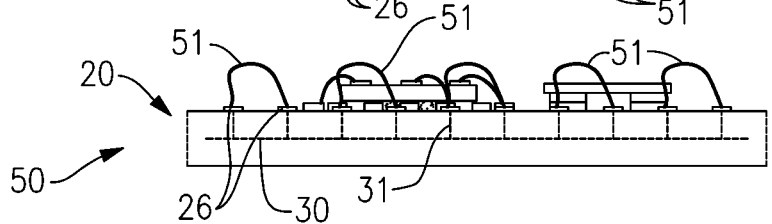
FIG. 2J2

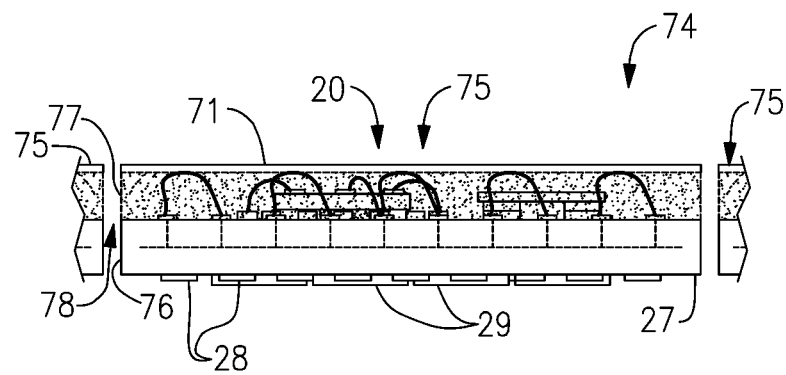
FIG.2R
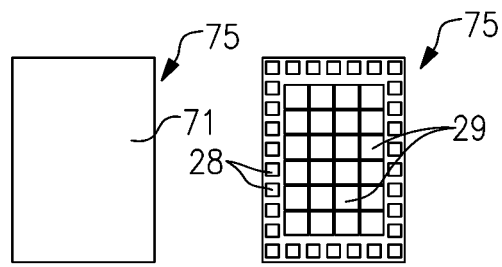
FIG.2S1    FIG.2S2
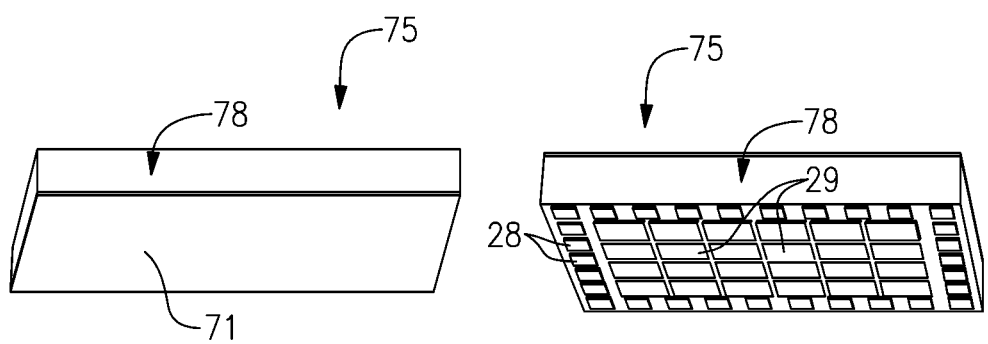
FIG.2S3

SYSTEMS AND METHODS FOR PROVIDING INTRAMODULE RADIO FREQUENCY ISOLATION

CROSS-REFERENCE TO RELATED APPLICATIONS

This application claims priority to U.S. Provisional Application No. 61/707,673 filed Sep. 28, 2012, entitled SYSTEMS AND METHODS FOR PROVIDING INTRAMODULE RADIO FREQUENCY ISOLATION; U.S. Provisional Application No. 61/707,622 filed Sep. 28, 2012, entitled SEGMENTED CONDUCTIVE TOP LAYER FOR RADIO FREQUENCY ISOLATION; and U.S. Provisional Application No. 61/707,578 filed Sep. 28, 2012, entitled SEGMENTED CONDUCTIVE GROUND PLANE FOR RADIO FREQUENCY ISOLATION, the disclosure of each of which is hereby expressly incorporated by reference herein in its respective entirety.

BACKGROUND

1. Field

The present disclosure generally relates to the field of electronics, and more particularly, to devices and methods providing radio frequency (RF) isolation for electronic devices such as overmolded semiconductor packages.

2. Description of Related Art

Radio frequency (RF) is a common term for a range of frequency of electromagnetic radiation typically used to produce and detect radio waves. Such a range can be from about 30 kHz to 300 GHz. In some situations, operation of an electronic device can be adversely affected by undesired RF signals.

To address such problems, RF isolating structures and/or methods can provide reduced effects of undesired RF signals. Such RF shielding typically operates based on what is commonly referred to as the Faraday cage principle.

SUMMARY

Some embodiments disclosed herein provide an apparatus including a substrate, a first radio frequency device mounted on a surface of the substrate and a second radio frequency device mounted on the surface of the substrate. The apparatus may further include a first conductive ground layer disposed at least partially below the first radio frequency device, a first plurality of wirebond structures disposed on the substrate between the first radio frequency device and the second radio frequency device, and a molding dimensioned to encapsulate the first and second radio frequency devices and at least a portion of the wirebond structures. The apparatus may further include a first conductive top layer at least partially disposed above the radio frequency device, the first conductive top layer in electrical contact with one or more of the first plurality of wirebond structures such that the first conductive ground layer, the one or more of the first plurality of wirebond structures, and the first conductive top layer at least partially form a radio frequency barrier between the first radio frequency device and the second radio frequency device.

In certain embodiments, at least some of the first plurality of wirebond structures may form a first row between the first and second radio frequency devices. Furthermore, at least some of the first plurality of wirebond structures may form a second row, substantially parallel to the first row.

The apparatus can further include a third radio frequency device mounted on the substrate. The first and second radio frequency devices may be each electrically connected to the third radio frequency device. Furthermore, the first radio frequency device may include a first switching device, the second radio frequency device may include a second switching device, and the third radio frequency device may include an amplifier device. In certain embodiments, the apparatus includes a second plurality of wirebond structures disposed on the surface of the substrate between the first radio frequency device and the third radio frequency device, at least partially forming a radio frequency barrier between the first and third radio frequency devices. Furthermore, a third plurality of wirebond structures may be disposed on the surface of the substrate between the second radio frequency device and the third radio frequency device, at least partially forming a radio frequency barrier between the second and third radio frequency devices. In certain embodiments, at least some of the first plurality of wirebond structures can form a first row between the first and second radio frequency devices, and at least some of the second plurality of wirebond structures can form a second row between the first and third radio frequency devices, the second row being disposed at a substantially right angle with respect to the first row.

In some embodiments, a method of providing RF shielding for a plurality of devices can include providing a substrate; positioning a plurality of radio frequency devices on the substrate; disposing a first plurality of wirebond structures on the substrate between first and second devices of the plurality of radio frequency devices; and connecting the first plurality of wirebond structures between a conductive top layer and a conductive ground layer. The first plurality of wirebond structures, at least a portion of the conductive top layer, and at least a portion of the conductive ground layer may at least partially form a radio frequency barrier between the first device and the second device.

In certain embodiments, disposing a first plurality of wirebond structures on the substrate includes forming a first row of wirebond structures between the first and second devices. Disposing a first plurality of wirebond structures on the substrate may further include forming a second row of wirebond structures between the first and second devices, the second row being substantially parallel to the first row.

The plurality of radio frequency devices may include a third device. The method providing RF shielding may further include electrically connecting the first and second devices to the third device. In some embodiments, the first device includes a first switching device, the second device includes a second switching device, and the third device includes an amplifier device. The method may further include disposing a second plurality of wirebond structures on the substrate between the first device and the third device, the second plurality of wirebond structures at least partially forming a radio frequency barrier between the first and third devices. In addition, the method may include disposing a third plurality of wirebond structures on the substrate between the second device and the third device, the third plurality of wirebond structures at least partially forming a radio frequency barrier between the second and third radio frequency devices.

At least some of the first plurality of wirebond structures may form a first row between the first and second devices, and at least some of the second plurality of wirebond structures may form a second row between the first and third devices, the second row being disposed at a substantially right angle with respect to the first row.

Certain embodiments provide a wireless device including a first antenna, a second antenna, and a radio frequency (RF) module including a first switching device electrically coupled to the first antenna and a second switching device electrically coupled to the second antenna. The wireless device may further include a conductive top layer disposed at least partially above the first switching device, a conductive ground layer disposed at least partially below the first switching device, and a plurality of wirebond structures disposed between the first and second switching devices and connected to the conductive top layer and conductive ground layer, the plurality of wirebond structures at least partially forming a radio frequency barrier between the first and second switching devices. In certain embodiments, the RF module includes an amplifier device electrically connected to the first and second switching devices.

Certain embodiments provide an apparatus that includes a substrate, a first radio frequency device mounted on a surface of the substrate, and a second radio frequency device mounted on the surface of the substrate. The apparatus may further include a first conductive ground layer disposed at least partially below the first radio frequency device, a first plurality of wirebond structures disposed on the substrate between the first radio frequency device and the second radio frequency device, and a first conductive top layer disposed above the substrate and in electrical contact with one or more of the first plurality of wirebond structures such that the first conductive ground layer, the one or more of the first plurality of wirebond structures, and the first conductive top layer form a radio frequency barrier between the first radio frequency device and the second radio frequency device. The apparatus may further include a second conductive top layer disposed above the substrate, and a molding dimensioned to encapsulate the first and second radio frequency devices and at least a portion of each of the wirebond structures, wherein at least a portion of the first conductive top layer is disposed above the first radio frequency device and at least a portion of the second conductive top layer is disposed above the second radio frequency device, the first and second conductive top layers being at least partially electrically isolated from one another.

In certain embodiments, the first and second conductive top layers lie in a first plane at or substantially near a top surface of the molding. The first plane may be substantially parallel to a surface of the substrate. In addition, the first and second conductive top layers may be separated by at least one physical gap that spans a first portion of the first plane, the gap providing at least partial electrical isolation between the first and first conductive top layers.

The apparatus may include a third conductive top layer disposed above the substrate, wherein the third conductive top layer lies in the first plane and is at least partially electrically isolated from both the first and second conductive top layers. The third conductive top layer may be disposed at least partially above a third radio frequency device disposed on the substrate.

An apparatus in accordance with embodiments disclosed herein may further include a second conductive ground layer disposed at least partially below the second radio frequency device, the second conductive ground layer being at least partially electrically isolated from the first conductive ground layer. For example, the first conductive top layer may be substantially the same shape as, and disposed above, the first conductive ground layer, and the second conductive top layer is substantially the same shape as, and disposed above, the second conductive ground layer.

In certain embodiments, at least some of the first plurality of wirebond structures forms a first row between the first and second radio frequency devices. Furthermore, at least some of the first plurality of wirebond structures may form a second row, substantially parallel to the first row.

In certain embodiments, the first radio frequency device includes a first switching device, the second radio frequency device includes a second switching device, and the third radio frequency device includes an amplifier device.

In some embodiments, a method of providing RF shielding for a plurality of devices includes providing a substrate; positioning a plurality of radio frequency devices on the substrate; disposing a first plurality of wirebond structures on the substrate between first and second devices of the plurality of radio frequency devices; forming a first conductive ground layer; electrically connecting the first plurality of wirebond structures to the first conductive ground layer; forming a molding dimensioned to encapsulate the first and second devices and at least a portion of each of the first plurality of wirebond structures; forming a first conductive top layer, at least partially above the first device, on a first portion of a top surface of the molding, the first conductive top layer electrically contacting the first plurality of wirebond structures such that the first conductive ground layer, the first plurality of wirebond structures, and the first conductive top layer at least partially form a radio frequency barrier between the first device and the second device; and forming a second conductive top layer, at least partially above the second device, on a second portion of the top surface of the molding. The first and second conductive top layers may be at least partially electrically isolated from one another.

In certain embodiments, the first and second conductive top layers lie in a first plane at or substantially near the top surface of the molding. The first plane is substantially parallel to the surface of the substrate.

In some embodiments, forming the first and second conductive top layers comprises creating a physical gap between at least two portions of a single conductive layer. The method may also include forming a third conductive top layer on a third portion of the top surface of the molding in the first plane, wherein the third conductive top layer is at least partially electrically isolated from both the second and second conductive top layers. The plurality of radio frequency devices may include a third device, the third conductive top layer being disposed at least partially above the third device. The method of claim 31 further comprising forming a second conductive ground layer, the second conductive ground layer being at least partially electrically isolated from the first conductive ground layer. The first conductive top layer may be substantially the same shape as, and disposed above, the first conductive ground layer, and the second conductive top layer is substantially the same shape as, and disposed above, the second conductive ground layer.

Some embodiments provide an apparatus that includes a substrate, a first radio frequency device mounted on the substrate, and a second radio frequency device mounted on the substrate. The apparatus may further include a first conductive ground layer disposed below the surface of the substrate, a first plurality of wirebond structures disposed on the surface of the substrate between the first radio frequency device and the second radio frequency device, and a first conductive top layer disposed above the substrate and in electrical contact with the first plurality of wirebond structures such that the first conductive ground layer, the first plurality of wirebond structures, and the first conductive top layer at least partially form a radio frequency barrier between the first radio frequency device and the second radio frequency device. The apparatus may further include a molding dimensioned to encapsulate the first and second radio frequency devices and at least a portion of the first plurality of wirebond structures, wherein at least a portion of the first conductive top layer is disposed above the first radio frequency device and wherein no conductive top layer is disposed above any portion of the second radio frequency device.

Some embodiments provide an apparatus that includes a substrate, a first radio frequency device mounted on the substrate, and a second radio frequency device mounted on the substrate. The apparatus may further include a first plurality of wirebond structures disposed on the substrate between the first radio frequency device and the second radio frequency device, a first conductive ground layer disposed at least partially below the first radio frequency device and in electrical contact with one or more of the first plurality of wirebond structures, and a second conductive ground layer disposed at least partially below the second radio frequency device, the second conductive ground layer being at least partially electrically isolated from the first conductive ground layer. The apparatus may further include a molding dimensioned to encapsulate the first and second radio frequency devices and at least a portion of the first plurality of wirebond structures and a first conductive top layer disposed above a top surface of the molding and in electrical contact with one or more of the first plurality of wirebond structures; wherein the first conductive top layer, the first plurality of wirebond structures, and the first conductive ground layer at least partially form a radio frequency barrier between the first radio frequency device and the second radio frequency device. At least a portion of the first conductive ground layer may disposed below the first radio frequency device and at least a portion of the second conductive ground layer may be disposed below the second radio frequency device.

The first and second conductive ground layers may lie in a first plane at or substantially near the surface of the substrate. Furthermore, the first plane may be substantially parallel to the surface of the substrate and/or the first and second conductive ground layers may be separated by at least one physical gap that spans a first portion of the first plane, the gap providing at least partial electrical isolation between the first and second conductive ground layers.

In certain embodiments, the apparatus includes a third conductive ground layer, wherein the third conductive ground layer lies in the first plane and is at least partially electrically isolated from both the first and second conductive ground layers. The third conductive top layer may be disposed at least partially below a third radio frequency device disposed on the substrate.

In certain embodiments, the apparatus includes a second conductive top layer disposed the top surface of the molding, the second conductive top layer being at least partially electrically isolated from the first conductive top layer. The first conductive top layer may be substantially the same shape as, and disposed above, the first conductive ground layer, and the second conductive top layer may be substantially the same shape as, and disposed above, the second conductive ground layer.

In certain embodiments, at least some of the first plurality of wirebond structures forms a first row between the first and second radio frequency devices. At least some of the first plurality of wirebond structures may form a second row, substantially parallel to the first row. In some embodiments, the first radio frequency device includes a first switching device, the second radio frequency device includes a second switching device, and the third radio frequency device includes an amplifier device.

In some embodiments, a method of providing RF shielding for a plurality of devices includes providing a substrate; positioning a plurality of radio frequency devices on the substrate; disposing a first plurality of wirebond structures on the substrate between first and second devices of the plurality of radio frequency devices; forming a first conductive ground layer; electrically connecting the first plurality of wirebond structures to the first conductive ground layer; forming a second conductive ground layer; forming a molding dimensioned to encapsulate the first and second devices and at least a portion of the first plurality of wirebond structures; and forming a first conductive top layer, at least partially above the first device, on a first portion of a top surface of the molding, the first conductive layer electrically contacting the first plurality of wirebond structures such that the first conductive ground layer, the first plurality of wirebond structures, and the first conductive top layer at least partially form a radio frequency barrier between the first device and the second device. The first and second conductive ground layers are at least partially electrically isolated from one another.

In certain embodiments, the first and second conductive ground layers lie in a first plane at or substantially near a surface of the substrate. The first plane may be substantially parallel to the surface of the substrate. The first and second conductive ground layers may be separated by at least one physical gap that spans a first portion of the first plane, the gap providing at least partial electrical isolation between the first and second conductive ground layers.

In certain embodiments, the method further includes forming a third conductive ground layer and positioning the third conductive ground layer in the first plane, wherein the third conductive ground layer is at least partially electrically isolated from both the first and second conductive ground layers. The plurality of radio frequency devices may include a third device, the third conductive ground layer being disposed at least partially below the third device.

In certain embodiments, the method further includes forming a second conductive top layer on a second portion of the top surface of the molding, the second conductive top layer being at least partially electrically isolated from the first conductive top layer. The first conductive top layer may be substantially the same shape as, and disposed above, the first conductive ground layer, and the second conductive top layer is substantially the same shape as, and disposed above, the second conductive ground layer.

Certain embodiments disclosed herein provide a wireless device including a first antenna, a second antenna and a radio frequency (RF) module including a first switching device electrically coupled to the first antenna and a second switching device electrically coupled to the second antenna. The wireless device may further include a plurality of wirebond structures disposed between the first and second switching devices, a first conductive ground layer disposed at least partially below the first switching device and in electrical contact with the plurality of wirebond structures, and a second conductive ground layer disposed at least partially below the second switching device, the second conductive ground layer being at least partially electrically isolated from the first conductive ground layer. In certain embodiments, the wireless device further includes a first conductive top layer disposed at least partially above the first switching device and in electrical contact with the plurality of wirebond structures; the first conductive top layer, the plurality of wirebond structures, and the first conductive ground layer may at least partially form a radio frequency barrier between the first switching device and the second switching device.

In certain embodiments, the RF module includes an amplifier device electrically connected to the first and second switching devices. The wireless device may further include a third conductive ground layer disposed at least partially below the amplifier device, the third conductive ground layer being at least partially electrically isolated from the first and second conductive ground layers.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/039,791, entitled SEGMENTED CONDUCTIVE TOP LAYER FOR RADIO FREQUENCY ISOLATION, and U.S. patent application Ser. No. 14/039,793, entitled SEGMENTED CONDUCTIVE GROUND PLANE FOR RADIO FREQUENCY ISOLATION, the disclosure of each of which is filed on even date herewith and hereby incorporated by reference herein in its entirety.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIGS. 2A1 and 2A2 show front and back sides of an example laminate panel configured to receive a plurality of dies for formation of packaged modules.

FIGS. 2B1 to 2B3 show various views of a laminate substrate of the panel configured to yield an individual module.

FIGS. 2E1 and 2E2 show various views of the laminate substrate being prepared for mounting of example surface-mount technology (SMT) devices.

FIGS. 2F1 and 2F2 show various views of the example SMT devices mounted on the laminate substrate.

FIGS. 2G1 and 2G2 show various views of the laminate substrate being prepared for mounting of an example die.

FIGS. 2H1 and 2H2 show various views of the example die mounted on the laminate substrate.

FIGS. 2I1 and 2I2 show various views of the die electrically connected to the laminate substrate by example wirebonds.

FIGS. 2J1 and 2J2 show various views of wirebonds formed on the laminate substrate and configured to facilitate electromagnetic (EM) isolation between an area defined by the wirebonds and areas outside of the wirebonds.

FIG. 2R shows individual packaged modules being cut from the panel.

FIGS. 2S1 to 2S3 show various views of an individual packaged module.

DETAILED DESCRIPTION

The headings provided herein are for convenience only and do not necessarily affect the scope or meaning of the claimed invention.

Disclosed herein are various devices and methodologies for providing radio frequency (RF) isolation or shielding for one or more active or a passive RF devices. For the purpose of description, it will be understood that RF can include electromagnetic signals having a frequency or a range of frequencies associated with wireless devices. RF can also include electromagnetic signals that radiate within an electronic device, whether or not such an electronic device operates as a wireless device. RF can also include signals or noises typically associated with electromagnetic interference (EMI) effects.

For the purpose of description it will be understood that RF devices can include devices configured to operate at RF ranges to facilitate transmitting and/or receiving of RF signals, as well as devices that can influence other devices by, or be influenced by, RF signals or noises. Non-limiting examples of such RF devices can include semiconductor dies with or without RF circuitry. Non-limiting examples of such RF-related devices can include discrete devices such as inductors and capacitors, and even a length of a conductor.

For the purpose of description, it will be understood that the terms isolation and shielding can be used interchangeably, depending on the context of usage. For example, an RF device being shielded can include a situation where RF signal from another source is blocked, either partially or substantially fully. In another example, an RF device being isolated can include a situation where RF signal (e.g., noise or actively generated signal) is blocked, either partially or substantially fully, from reaching another device. Unless the context of usage specifically states otherwise, it will be understood that each of the terms shielding and isolation can include either or both of the foregoing functionalities.

The present disclosure includes descriptions of various examples of systems, apparatuses, devices, structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality.

Figure 1:
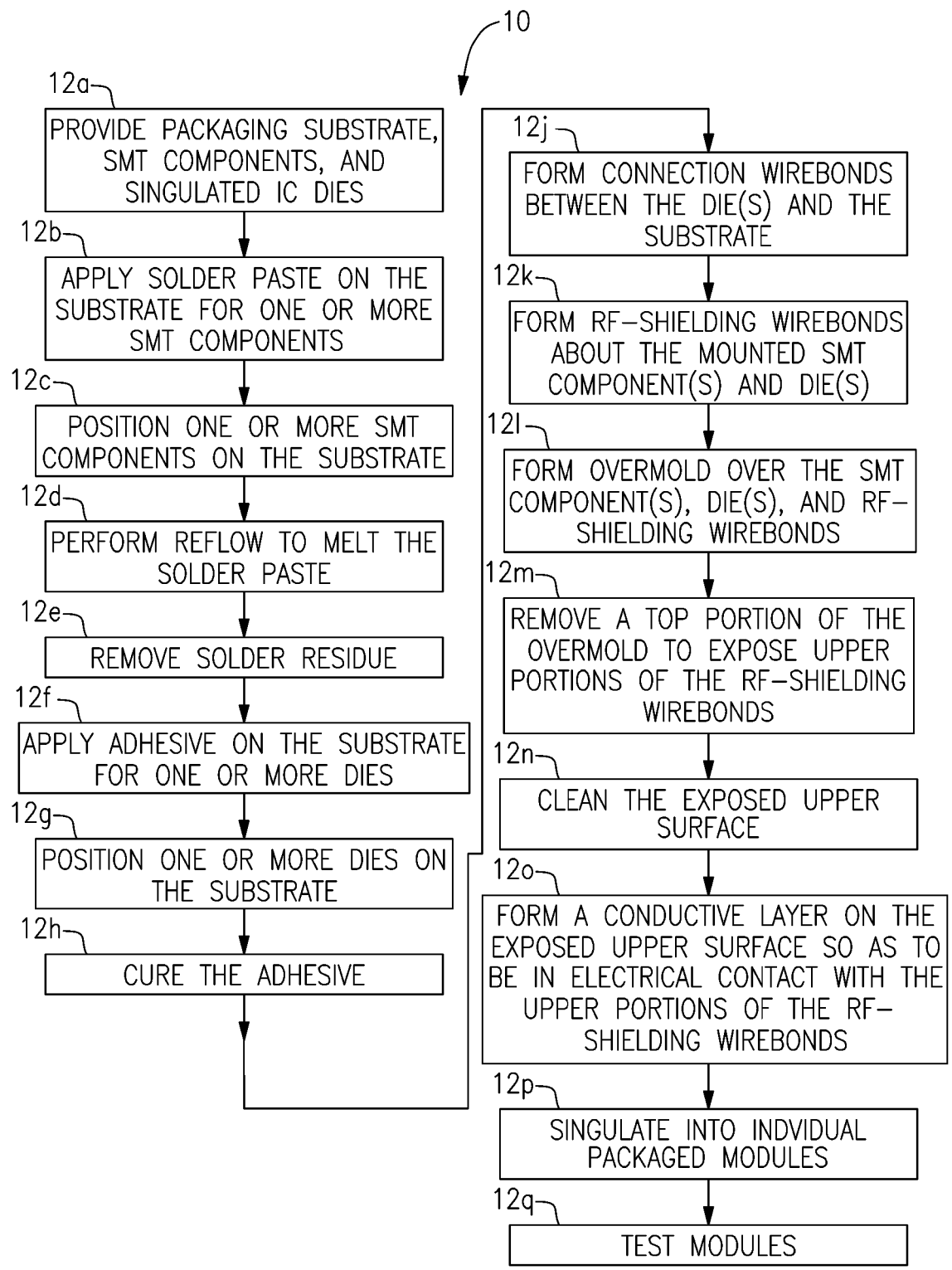
FIG. 1 shows a process that can be implemented to fabricate a packaged module that includes a die having an integrated circuit (IC).

FIG. 1 shows a process 10 that can be implemented to fabricate a packaged module having and/or via one or more features as described herein.

FIG. 2 shows various parts and/or stages of various steps associated with the process 10 of FIG. 1.

In block 12a of FIG. 1, a packaging substrate and parts to be mounted on the packaging substrate can be provided. Such parts can include, for example, one or more surface-mount technology (SMT) components and one or more singulated dies having integrated circuits (ICs). FIGS. 2A1 and 2A2 show that in some embodiments, the packaging substrate can include a laminate panel 16. FIG. 2A1 shows the example panel's front side; and FIG. 2A2 shows the panel's back side. The panel 16 can include a plurality of individual module substrates 20 arranged in groups that are sometimes referred to as cookies 18.

FIGS. 2B1-2B3 show front, side and back, respectively, of an example configuration of the individual module substrate 20. For the purpose of description herein, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 (e.g., connection wirebond contact pads) are arranged about the die-receiving area 23 so as to allow formation of electrical connections between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads 25 can be electrically connected to some of the module's contact pads 28 and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. In some embodiments, the ground plane 30 may or may not be connected to the ground contact pads 29 disposed on the back surface 27.

Figure 2C:
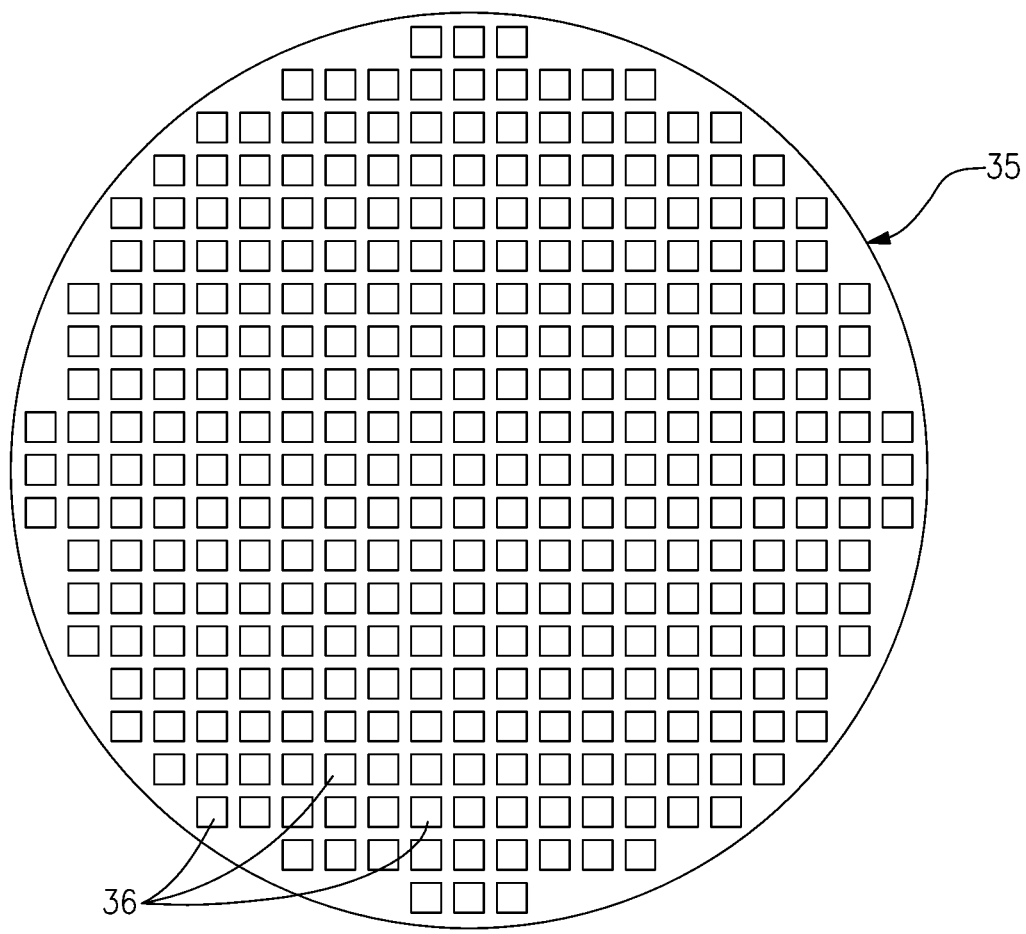
FIG. 2C shows an example of a fabricated semiconductor wafer having a plurality of dies that can be singulated for mounting on the laminate substrate.
Figure 2D:
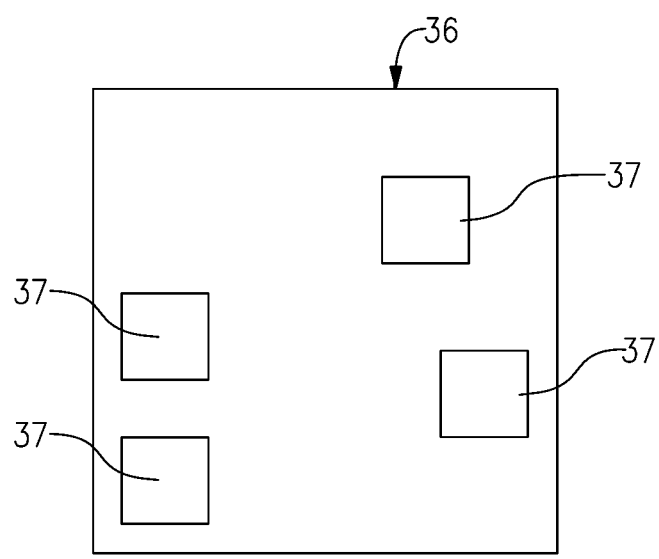
FIG. 2D depicts an individual die showing example electrical contact pads for facilitating connectivity when mounted on the laminate substrate.

FIG. 2C shows an example fabricated wafer 35 that includes a plurality of functional dies 36 awaiting to be cut (or sometimes referred to as singulated) into individual dies. Such cutting of the dies 36 can be achieved in a number of ways. FIG. 2D schematically depicts an individual die 36 where a plurality of metalized contact pads 37 can be provided. Such contact pads can be configured to allow formation of connection wirebonds between the die 36 and the contact pads 24 of the module substrate (e.g., FIG. 2B1).

In block 12b of FIG. 1, solder paste can be applied on the module substrate to allow mounting of one or more SMT devices. FIGS. 2E1 and 2E2 show an example configuration 40 where solder paste 41 is provided on each of the contact pads 25 on the front surface of the module substrate 20. In some implementations, the solder paste 41 can be applied to desired locations on the panel (e.g., 16 in FIG. 2A1) in desired amount by an SMT stencil printer.

In block 12c of FIG. 1, one or more SMT devices can be positioned on the solder contacts having solder paste. FIGS. 2F1 and 2F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12d of FIG. 1, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12e of FIG. 1, solder residue from the reflow operation of block 12d can be removed. By way of an example, the substrates can be run through a solvent or aqueous cleaning step. Such a cleaning step can be achieved by, for example, a nozzle spray, vapor chamber, or full immersion in liquid.

In block 12f of FIG. 1, adhesive can be applied on one or more selected areas on the module substrate 20 to allow mounting of one or more dies. FIGS. 2G1 and 2G2 show an example configuration 44 where adhesive 45 is applied in the die-mounting area 23. In some implementations, the adhesive 45 can be applied to desired locations on the panel (e.g., 16 in FIG. 2A1) in desired amount by techniques such as screen printing.

In block 12g of FIG. 1, one or more dies can be positioned on the selected areas with adhesive applied thereon. FIGS. 2H1 and 2H2 show an example configuration 46 where an example die 36 is positioned on the die-mounting area 23 via the adhesive 45. In some implementations, the die 36 can be positioned on the die-mounting area on the panel by an automated machine that is fed with dies from a tape reel.

In block 12h of FIG. 1, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12j of FIG. 1, electrical connections such as wirebonds can be formed between the mounted die(s) and corresponding contact pads on the module substrate 20. FIGS. 2I1 and 2I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12k of FIG. 1, a plurality of RF-shielding wirebonds can be formed about a selected area on the module substrate 20. FIGS. 2J1 and 2J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. As described herein, a conductive layer can be formed above such an area and connected to upper portions of the RF-shielding wirebonds 51 to thereby form an RF-shielded volume.

In the example configuration 50, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area.

In the example configuration 50, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 2J1 and 2J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 2K:
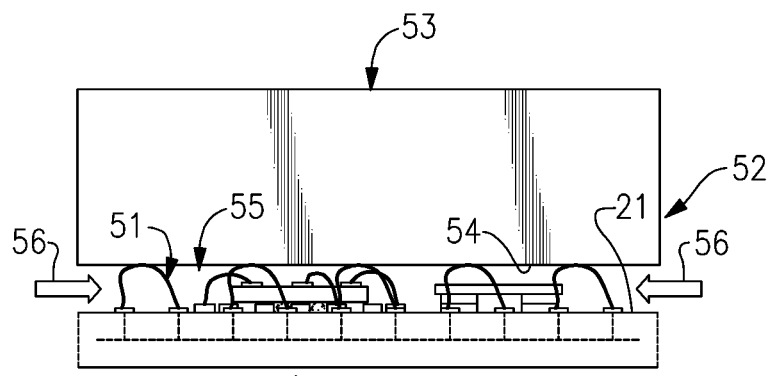
FIG. 2K shows a side view of molding configuration for introducing molding compound to a region above the laminate substrate.

In block 12l of FIG. 1, an overmold can be formed over the SMT component(s), die(s), and RF-shielding wirebonds. FIG. 2K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 2K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 2L:
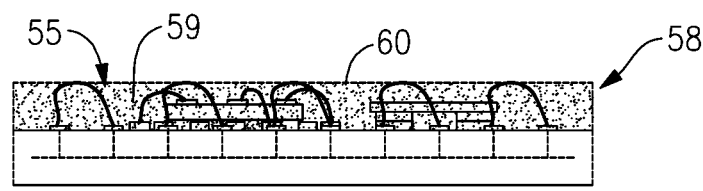
FIG. 2L shows a side view of an overmold formed via the molding configuration of FIG. 2K.

FIG. 2L shows an example configuration 58 where molding compound has been introduced into the volume 55 as described in reference to FIG. 2K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 2M:
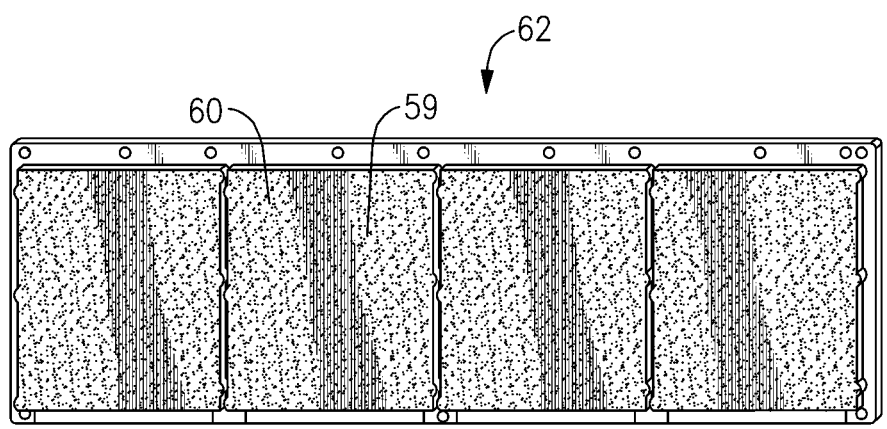
FIG. 2M shows the front side of a panel with the overmold.

FIG. 2M shows an example panel 62 that has overmold structures 59 formed over the multiple cookie sections. Each cookie section's overmold structure can be formed as described herein in reference to FIGS. 2K and 2L. The resulting overmold structure 59 is shown to define a common upper surface 60 that covers the multiple modules of a given cookie section.

The molding process described herein in reference to FIGS. 2K-2M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 2N:
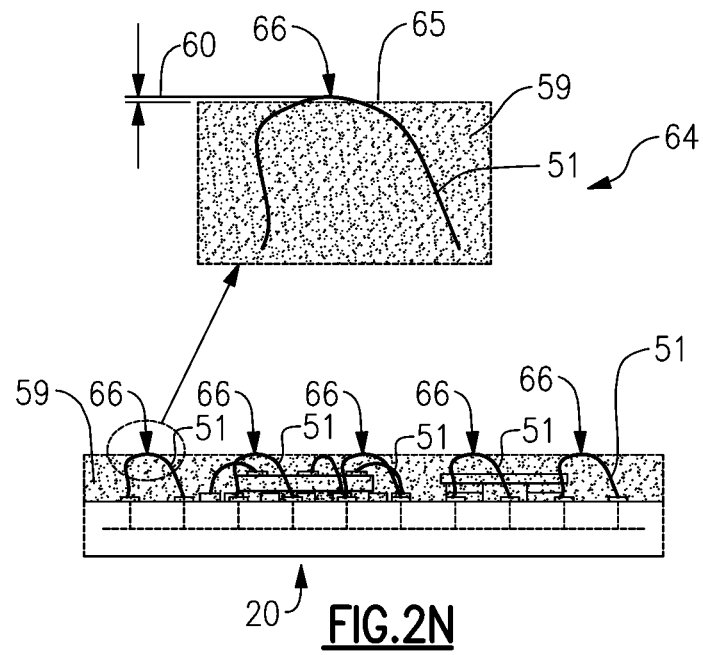
FIG. 2N shows a side view of how an upper portion of the overmold can be removed to expose upper portions of the EM isolation wirebonds.

In block 12m of FIG. 1, a top portion of the overmold structure can be removed to better expose upper portions of the RF-shielding wirebonds. FIG. 2N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 2O:
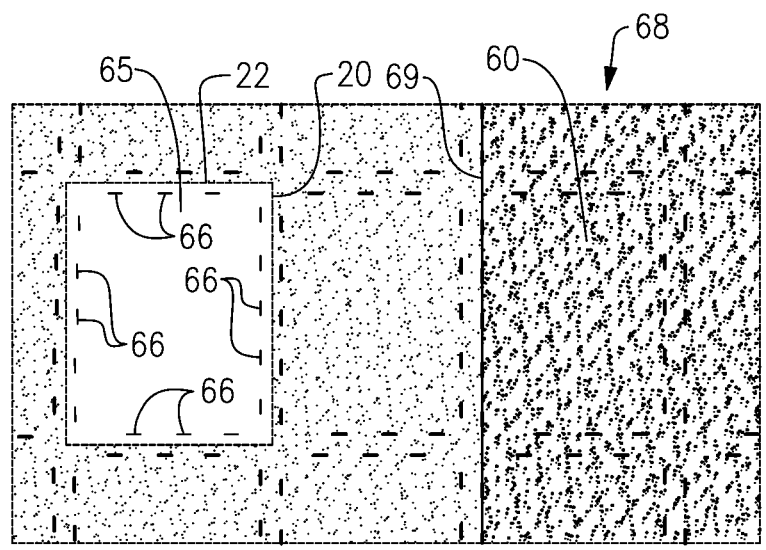
FIG. 2O shows a portion of a panel where a portion of the overmold has its upper portion removed to better expose the upper portions of the EM isolation wirebonds.

The foregoing removal of material from the upper portion of the overmold structure 59 can be achieved in a number of ways. FIG. 2O shows an example configuration 68 where such removal of material is achieved by sand-blasting. In the example, the left portion is where material has been removed to yield the new upper surface 65 and better exposed upper portions 66 of the RF-shielding wirebonds. The right portion is where material has not been removed, so that the original upper surface 60 still remains. The region indicated as 69 is where the material-removal is being performed.

In the example shown in FIG. 2O, a modular structure corresponding to the underlying module substrate 20 (depicted with a dotted box 22) is readily apparent from the exposed upper portions 66 of the RF-shielding wirebonds that are mostly encapsulated by the overmold structure 59. Such modules will be separated after a conductive layer is formed over the newly formed upper surface 65.

In block 12n of FIG. 1, the new exposed upper surface resulting from the removal of material can be cleaned. By way of an example, the substrates can be run through a solvent or aqueous cleaning step. Such a cleaning step can be achieved by, for example, a nozzle spray, or full immersion in liquid.

In block 12o of FIG. 1, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 2P:
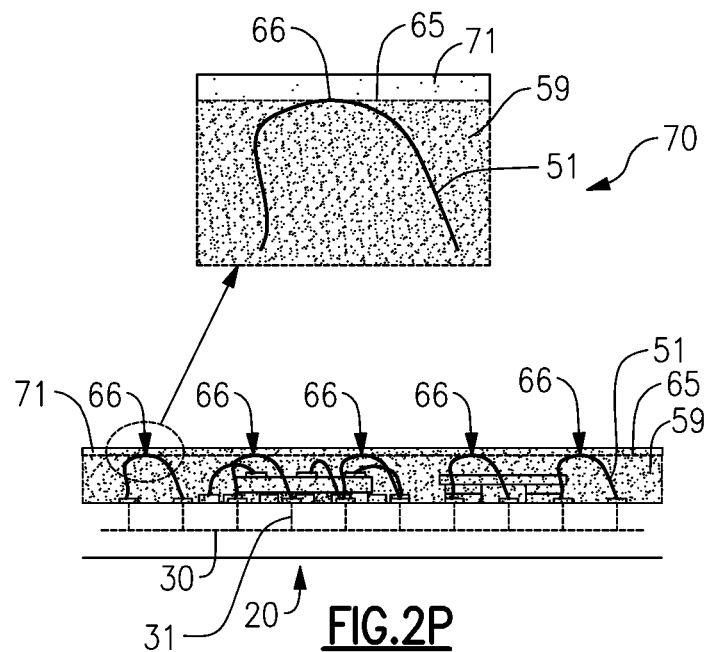
FIG. 2P shows a side view of a conductive layer formed over the overmold such that the conductive layer is in electrical contact with the exposed upper portions of the EM isolation wirebonds.

FIG. 2P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 2J, the RF-shielding wirebonds 51 and the ground plane 30 can yield an interconnected RF-shielding structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 2Q:
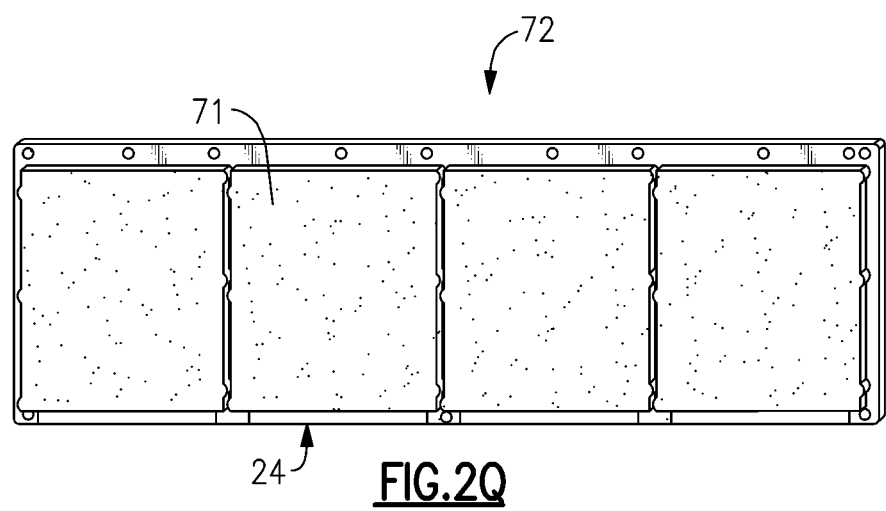
FIG. 2Q shows a panel where the conductive layer can be a spray-on metallic paint.

FIG. 2Q shows an example panel 72 that has been sprayed with conductive paint to yield an electrically conductive layer 71 that covers multiple cookie sections. As described in reference to FIG. 2M, each cookie section includes multiple modules that will be separated.

In block 12p of FIG. 1, the modules in a cookie section having a common conductive layer (e.g., a conductive paint layer) can be singulated into individual packaged modules. Such singulation of modules can be achieved in a number of ways, including a sawing technique.

FIG. 2R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 2B, the lower surface 27 of the separated module 75 includes contact pads 28, 29 to facilitate electrical connections between the module 75 and a circuit board such as a phone board.

FIGS. 2S1, 2S2 and 2S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 1, the singulated modules can be tested for proper functionality. As discussed above, the modular form allows such testing to be performed easier. Further, the module's internal RF-shielding functionality allows such testing to be performed without external RF-shielding devices.

Figure 2T:
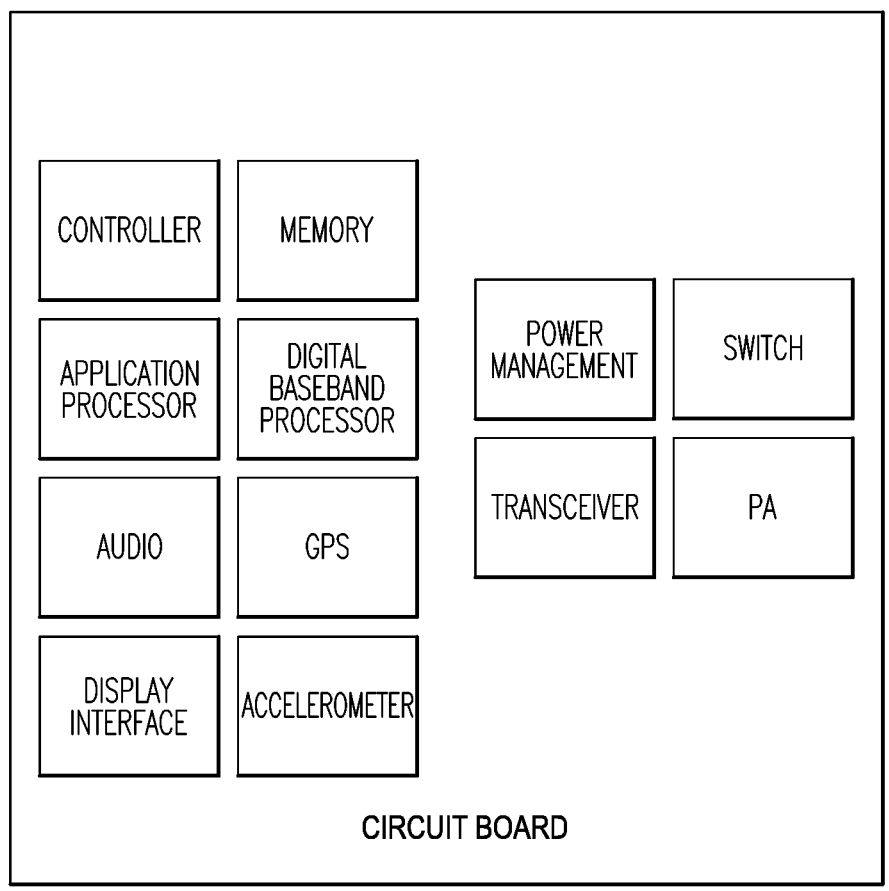
FIG. 2T shows that one or more of modules that are mounted on a circuit board such as a wireless phone board can include one or more features as described herein.

FIG. 2T shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier module.

Figure 3A:
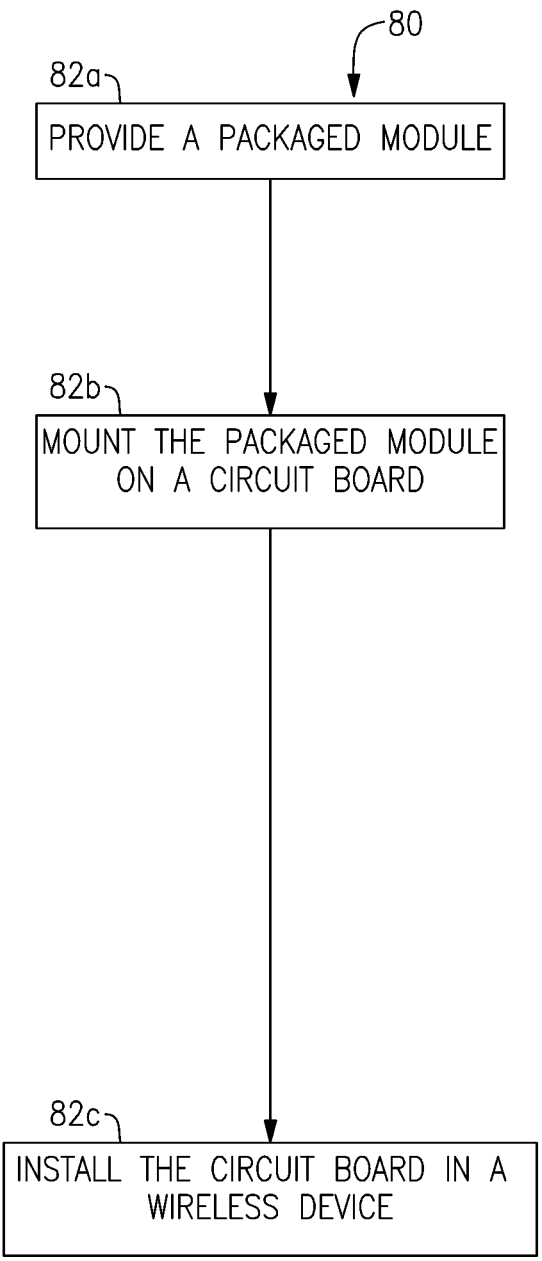
FIG. 3A shows a process that can be implemented to install a packaged module having one or more features as described herein on the circuit board of FIG. 2T.
Figure 3B:
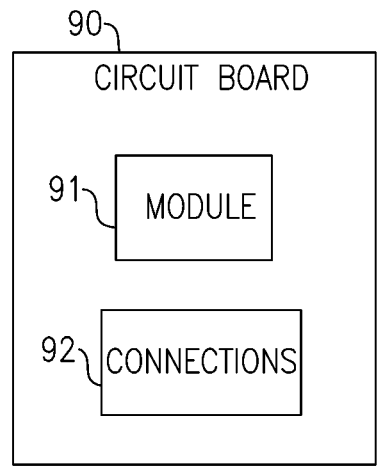
FIG. 3B schematically depicts the circuit board with the packaged module installed thereon.

FIG. 3A shows a process 80 that can be implemented to assemble a packaged module having one or more features as described herein on a circuit board. In block 82a, a packaged module can be provided. In some embodiments, the packaged module can represent a module described in reference to FIG. 2T. In block 82b, the packaged module can be mounted on a circuit board (e.g., a phone board). FIG. 3B schematically depicts a resulting circuit board 90 having module 91 mounted thereon. The circuit board can also include other features such as a plurality of connections 92 to facilitate operations of various modules mounted thereon.

Figure 3C:
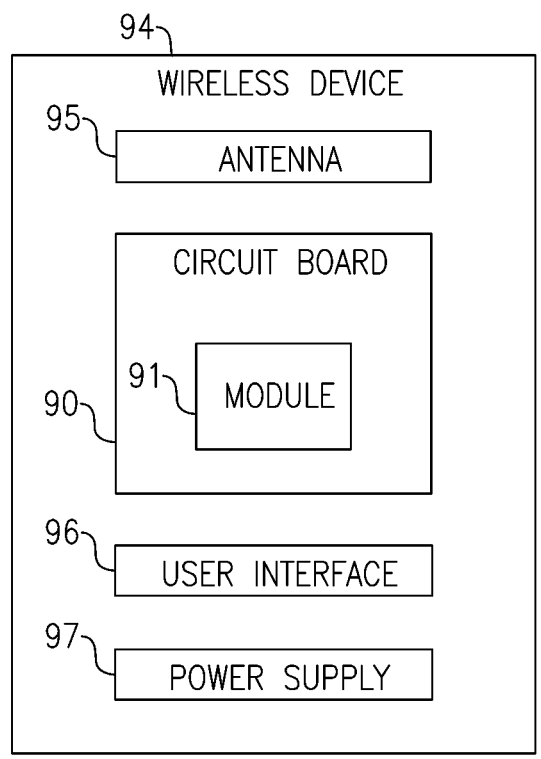
FIG. 3C schematically depicts a wireless device having the circuit board with the packaged module installed thereon.

In block 82c, a circuit board having modules mounted thereon can be installed in a wireless device. FIG. 3C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

Figure 4:
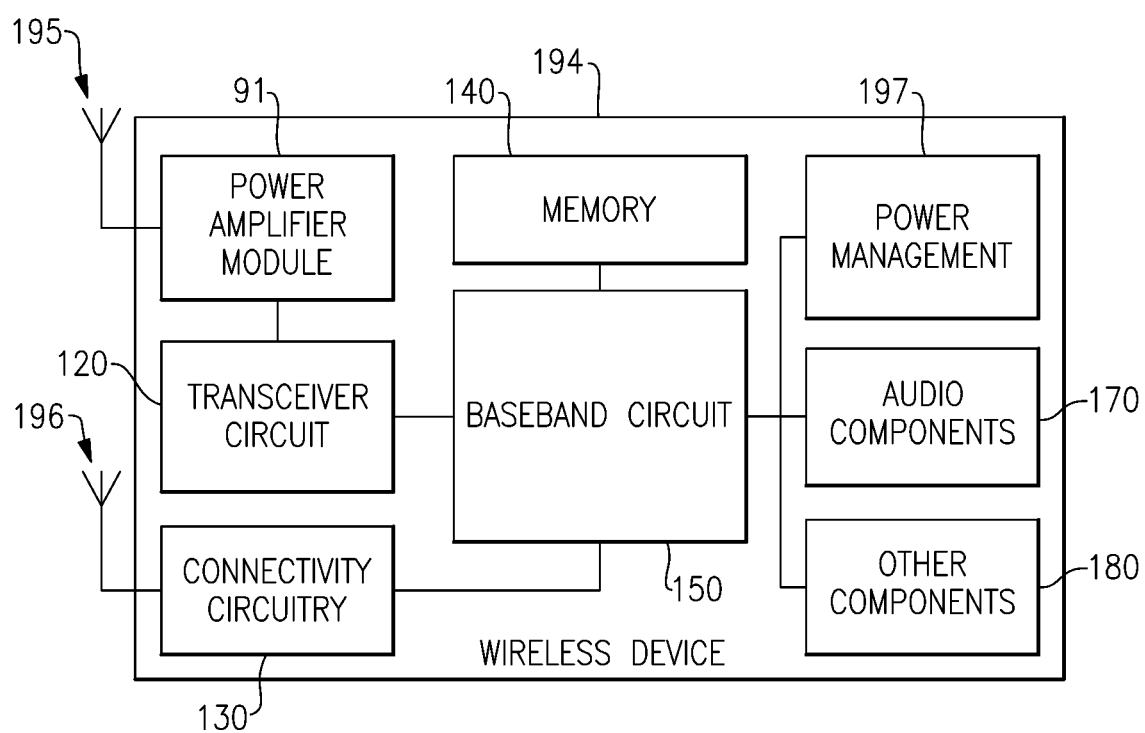
FIG. 4 schematically depicts an embodiment of a wireless device in accordance with aspects of the present disclosure.

FIG. 4 illustrates a more detailed block diagram of an embodiment of a wireless device 194 in accordance with one or more aspects of the present disclosure. Applications of the present disclosure are not limited to wireless devices and can be applied to any type of electronic device, with or without a power amplifier or power amplifier module. For example, embodiments can be applied to wired devices, weather sensing devices, RADAR, SONAR, microwave ovens, and any other device that might include functionality similar to that provided by the various blocks shown in FIG. 4. Further, embodiments of the present disclosure can be applied to devices that may include one or more components controlled via a front end interface. Although the present disclosure is not limited to wireless devices or devices containing power amplifiers, to simplify discussion, a number of embodiments will be described with respect to the wireless device 194 and power amplifier module 191.

The wireless device 194 can include a power amplifier module 191. The power amplifier module 191 can generally include any component or device that includes a power amplifier. In certain embodiments, the power amplifier module 191 includes multiple power amplifiers. For example, the power amplifier module 191 may include separate power amplifiers for amplification of signals conforming to one or more different wireless data transmission standards, such as GSM, WCDMA, LTE, EDGE, etc. Furthermore, the power amplifier module 191 may be combined with the transceiver circuit 120 in a single module. Power amplifiers incorporated in the power amplifier module 191 may be single-stage or multi-stage power amplifiers, as desired.

The power amplifier module 191 may include a power amplifier controller for controlling the power amplifier. Although not limited as such, controlling the power amplifier module 191 generally refers to setting, modifying, or adjusting the amount of power amplification provided by one or more power amplifiers of the power amplifier module 191. The power amplifier module 91 may be a single component that includes the functionality of a power amplifier controller and one or more power amplifiers. In other implementations, the wireless device 194 may include separate power amplifier control circuitry and power amplifier(s).

The wireless device 194 may include one or more additional RF components, such as the transceiver circuit 120. In certain embodiments, the wireless device comprises a plurality of transceiver circuits, such as to accommodate operation with respect to signals conforming to one or more different wireless data communication standards. The transceiver circuit 120 may serve as a signal source that determines or sets a mode of operation of one or more components of the power amplifier module 91. Alternatively, or in addition, baseband circuit 150, or one or more other components that are capable of providing one or more signals to the power amplifier module 91 may serve as a signal source provided to power amplifier module 91.

The transceiver circuit 120 and/or power amplifier module 91 may be electrically coupled to the baseband circuit 150, which processes radio functions associated with signals received and/or transmitted by one or more antennas (e.g., 195, 196). Such functions may include, for example, signal modulation, encoding, radio frequency shifting, or other function. The baseband circuit 150 may operate in conjunction with a real-time operating system in order to accommodate timing-dependent functionality. In certain embodiments, the baseband circuit 150 includes or is connected to a central processor. For example, the baseband circuit and central processor may be combined (e.g., part of a single integrated circuit), or may be separate modules or devices.

The baseband circuit is connected, either directly or indirectly, to a memory module 140, which contains one or more volatile and/or non-volatile memory, or data storage, devices or media. Examples of types of storage devices that may be included in the memory module 140 include Flash memory, such as NAND Flash, DDR SDRAM, Mobile DDR SRAM, or any other suitable type of memory, including magnetic media, such as a hard disk drive. Furthermore, the amount of storage included in memory module 140 may vary based on one or more conditions, factors, or design preferences. For example, the memory module 140 may contain approximately 256 MB, or any other suitable amount of storage, such as 1 GB or more. The amount of memory included in wireless device 194 may depend on factors such as, for example, cost, physical space allocation, processing speed, etc.

The wireless device 194 includes a power management module 97. The power management module includes, among possibly other things, a battery or other power source. For example, the power management module 197 may include one or more lithium-ion batteries. In addition, the power management module 97 may include a controller module for management of power flow from the power source to one or more devices of wireless device 94. Although the power management module 97 may be described herein as including a power source in addition to a power management controller, the terms "power source" and "power management," as used herein, may refer to either power provision, power management, or both, or any other power-related device or functionality.

The wireless device 94 may include one or more audio components 170. Example components may include one or more speakers, earpieces, headset jacks, and/or other audio components. Furthermore, the audio component module 170 may include audio compression and/or decompression circuitry (i.e., "codec"). An audio codec may be included for encoding signals for transmission, storage or encryption, or for decoding for playback or editing, among possibly other things.

The wireless device 194 includes connectivity circuitry 130 comprising one or more devices for use in receipt and/or processing of data from one or more outside sources. To such end, the connectivity circuitry 130 may be connected to one or more antennas 196. For example, the connectivity circuitry 130 may include one or more power amplifier devices, each of which is connected to an antenna. The antenna 196 may be used for data communication in compliance with one or more communication protocols, such as Wi-Fi (i.e., compliant with one or more of the IEEE 802.11 family of standards) or Bluetooth, for example. Multiple antennas and/or power amplifiers may be desirable to accommodate transmission/reception of signals compliant with different wireless communications protocols. Furthermore, the connectivity circuitry 130 may include a Global Positioning System (GPS) receiver.

The connectivity circuitry 130 may include one or more other communication portals or devices. For example, the wireless device 194 may include physical slots, or ports, for engaging with Universal Serial Bus (USB), Mini USB, Micro USB, Secure Digital (SD), miniSD, microSD, subscriber identification module (SIM), or other types of devices The wireless device 194 includes one or more additional components 180. Examples of such components may include a display, such as an LCD display. The display may be a touchscreen display. Furthermore, the wireless device 194 may include a display controller, which may be separate from, or integrated with, the baseband circuit 150 and/or a separate central processor. Other example components that may be included in the wireless device 194 may include one or more cameras (e.g., cameras having 2 MP, 3.2, MP, 5 MP, or other resolution), compasses, accelerometers, optical sensors, or other functional devices. The wireless device 194 can include a number of additional components. At least some of these additional components may receive power from the power management module 160. For example, the wireless device 194 can include a digital to analog convertor (DAC), a user interface processor 132, and/or an analog to digital convertor (ADC), among possibly other things.

The components described above in connection with FIG. 4 and the wireless device 194 are provided as examples, and are non-limiting. Moreover, the various illustrated components may be combined into fewer components than illustrated in FIG. 4, or separated into additional components. For example, the baseband circuit 150 can be combined with the transceiver circuit 120. As another example, the transceiver 120 can be split into separate receiver and transmitter modules.

Intramodule Shielding

Figure 5:
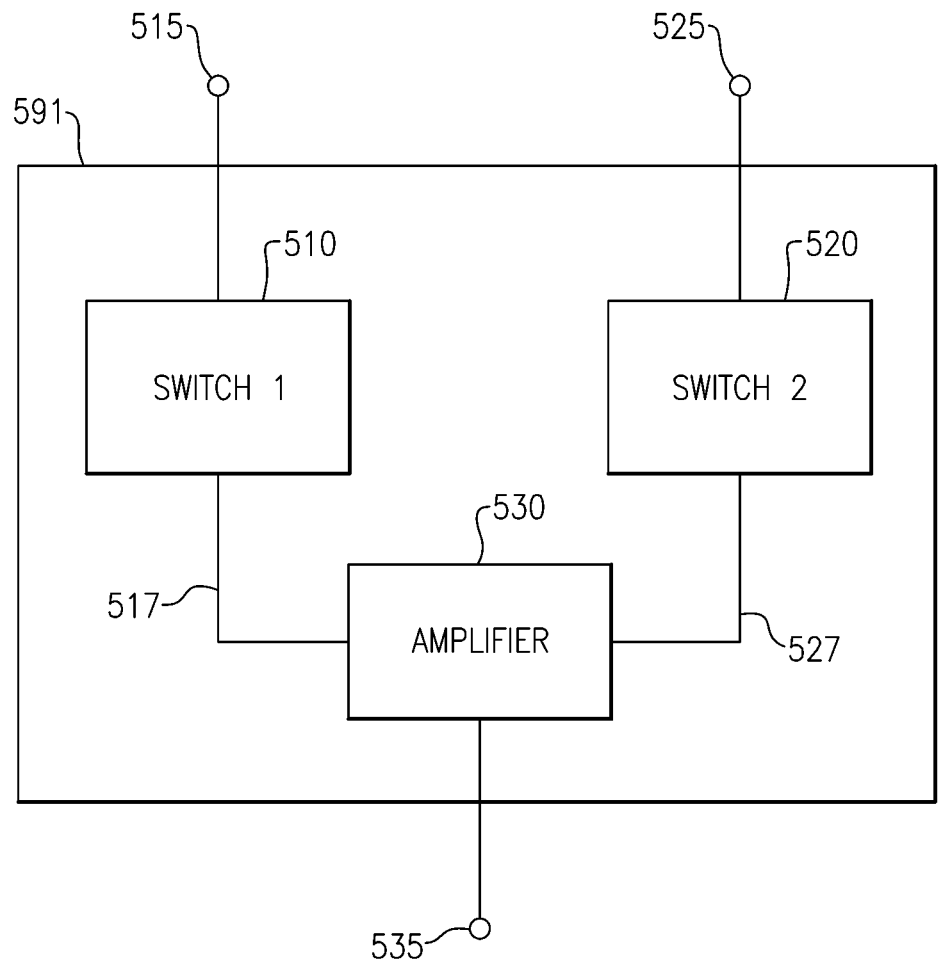
FIG. 5 schematically depicts an embodiment of an electronic device having a plurality of radiofrequency (RF) devices.

FIG. 5 schematically depicts an electronic device 591 having a plurality of packaged components (510, 520, 530), such as chips. The chips 510, 520, 530 may include one or more RF devices. The chips 510, 520, for example, may comprise switches connected to input and/or output ports 515 and 525, respectively. In certain embodiments, the ports 515 and 525 are each connected to an antenna (not shown), or other external RF influence. The switches 515, 525 may be configured to relay a signal, or a modified signal, from the respective antennas to an amplifier device 530 along transmission lines 517 and 527. The amplifier 530 may provide a signal to an output port 535 for use by a wireless device.

In certain embodiments, the electronic device 591 may be configured to operate while receiving signals on more than one input line. The switches 510 and 520 may be configured such that one of the input signals is transmitted, but not the other. However, physical proximity, as well as other factors, may contribute to undesirable RF influence between RF devices. For example, signal input to switch 2 that is not relayed to the amplifier 530, may interfere with signal input to switch 510 that is desirably passed on to amplifier 530. Therefore, it may be desirable to provide RF isolation between one or more of the devices depicted in FIG. 5 in order to improve performance of the electronic device 591 under certain conditions.

Figure 6A:
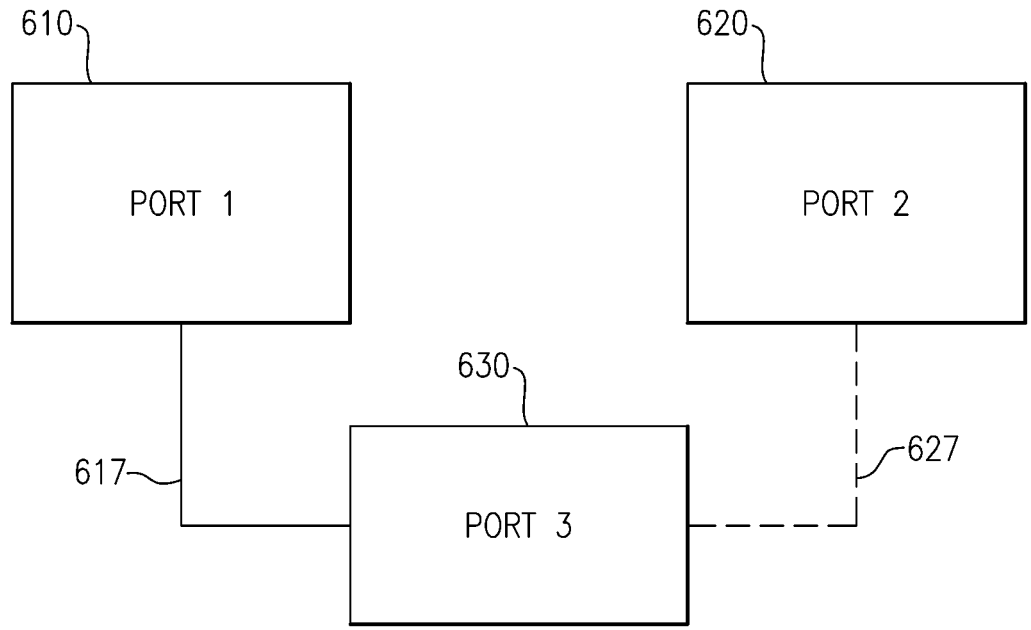
FIGS. 6A-6B schematically depict embodiments of RF devices having various connections.
Figure 6B:
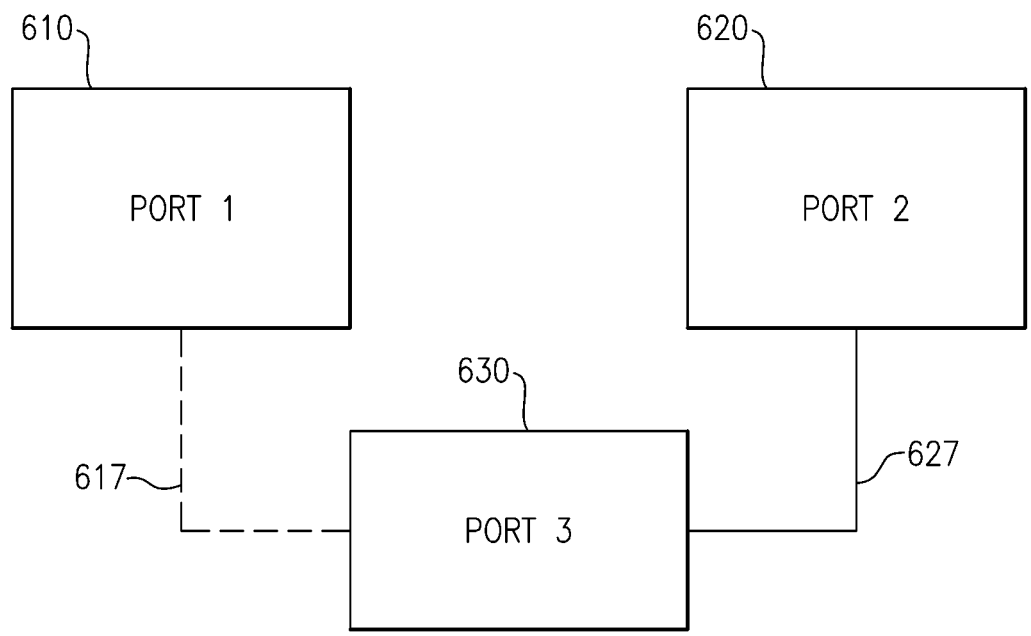

FIGS. 6A and 6B provide block diagrams representing certain embodiments of configurations of RF devices, specifically, the devices labeled "Port 1" 610, "Port 2" 620, and "Port 3" 630. The devices 610, 620, and 630 may be disposed on a single semiconductor die, or may be components of separate structures. Each of the devices depicted may be electrically connected to one or more other devices not shown. For example, Ports 1 and 2 may each be connected to Port 3 via conductive channels or paths, identified by reference numbers 617 and 627 respectively. In FIGS. 6A and 6B, dashed connecting lines indicate a connection that has been impeded, obstructed, or disconnected in some manner, such as through activation or deactivation of an electrical switch. Therefore, as shown, the embodiment depicted in FIG. 6A includes a configuration in which an electrical channel 617 is open between Port 1 and Port 3, while the channel 627 between Port 2 and Port 3 is switched "off," or closed to some degree. The reverse configuration is depicted in FIG. 6B, where the channel 627 between Port 2 and Port 3 is open, while the channel 617 between Port 1 and Port 3 is closed.

As described above, wires associated with RF devices emit/radiate power that can cause electromagnetic interference (EMI) when such power is not drawn to ground sufficiently, resulting in cross-talk between ports. Therefore, it may be necessary or desirable, depending on system needs/requirements, to prevent three-dimensional (3D) coupling between the various ports illustrated in FIGS. 6A and 6B. In certain embodiments, although the electrical connection between two ports (e.g., conductive path 627 between Ports 1 and 3) may be in an off state, there may still be a constant signal present between the two ports. For example, in an embodiment, a wireless device includes multiple antennas, each providing a signal source that can be relayed to Port 3 via one of the other ports. Such antennas and/or ports may continue to operate or receive a signal when the conductive path associated with such antennas/ports is turned off. Such undesirable signal can advantageously be directed to electrical ground in order to reduce interference with other modules or devices. However, in certain embodiments, the electrical ground connection available is inadequate to discharge the unwanted EMI.

It may be undesirable for an open communication channel between RF devices to experience interference from other RF devices. For example, in the embodiment of FIG. 6A, data communication may be desirably carried out between Port 1 and Port 3. However, if Port 2 is also receiving or carrying a signal, such a signal may interfere to some extent with communication between Port 1 and Port 3, in spite of channel 627 being switched off. Such interference can be the result of parasitic harmonics propagating between devices. Interference can introduce unwanted, or unacceptable, noise into the system, depending on the specific system characteristics or requirements. Therefore, RF isolation between one or more of the devices shown may be desirable or necessary.

Intramodule Shielding Walls

Figure 7:
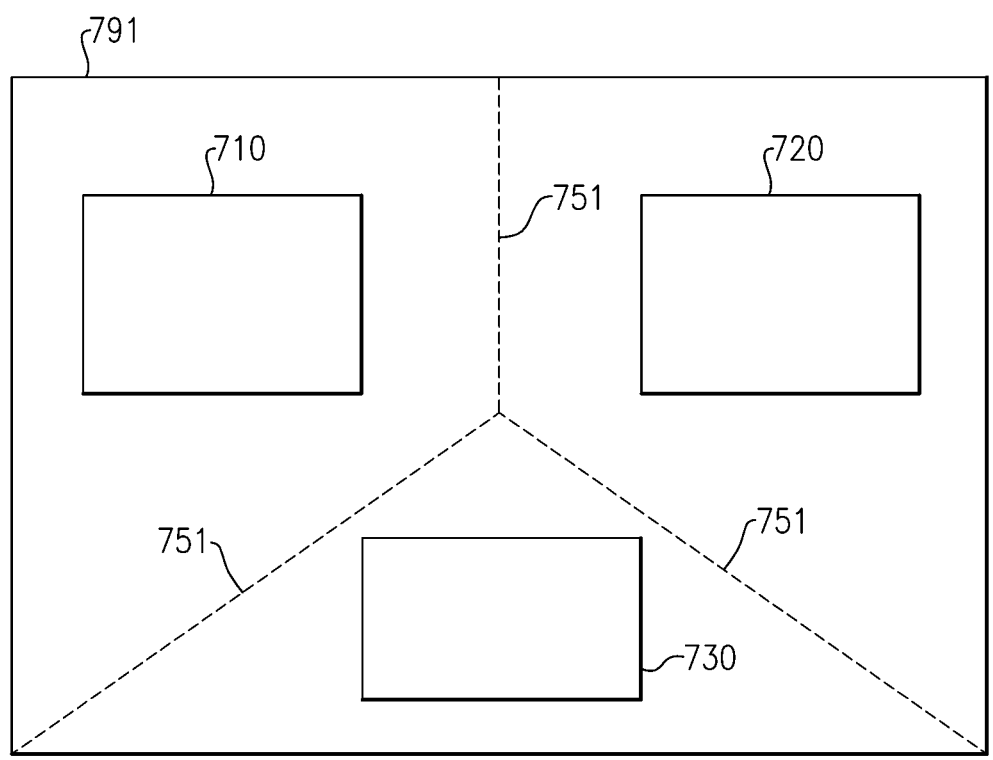
FIG. 7 schematically depicts an embodiment of an electronic device having a plurality of RF devices.

FIG. 7 provides a block diagram of a packaged module 791 with a plurality of RF devices disposed thereon, 710, 720, and 730. The dashed lines identified by reference number 751 represent planes, or barriers between the various RF devices that may provide at least partial RF isolation between the devices. In certain embodiments, one or more RF-shielding structures 751 are formed adjacent to one or more of the devices so as to provide RF isolation properties. In some implementations, the RF-shielding structure can be configured to provide RF isolation functionality, such as isolating a device from an RF influence of another device on the packaged module 791, isolating the device from an external RF influence originating from outside the packaged module 791, and/or preventing escape of RF signals or noises from the device to regions such as other devices and/or external RF sources (not shown).

RF isolation between two devices may be accomplished in a number of ways. For example, in certain embodiments, metal cans may be placed around one or more devices, shielding RF interference from or by such devices. In certain embodiments, physical separation of modules may provide some amount of RF isolation between devices. Therefore, it may be desirable to position devices on a single module as far from one another as practical in order to reduce interference. However, module size constraints may impede the ability to achieve satisfactory isolation using this technique alone. For example, a single board may not be large enough to provide adequate physical separation to meet isolation needs of a system using physical separation alone.

As described in some detail above with respect to FIGS. 1-3, in certain embodiments, at least partial RF isolation between two or more device may be achieved using wirebond structures. In certain embodiments, wirebonds are disposed between devices on a single packaged substrate 791. For example, wirebond structures may be placed on the substrate between devices 710, 720 and 730, such as along lines 751, or in some other configuration. The wirebonds may combine with one or more conductive layers, such as conductive top and/or ground layers to at least partially form a Faraday cage around or between one or more devices disposed within a single packaged module.

In some implementations of devices incorporating RF isolation using wirebond structures in accordance with embodiments disclosed herein, some or all of the wirebonds can be arranged about an RF device. Such an arrangement may take on a number of different forms or configurations. FIGS. 8A-8D show some non-limiting examples of such arrangements. In some embodiments, some or all of such wirebonds are constructed similarly to certain structures described in U.S. Publication No. US 2007/0241440 (U.S. application Ser. No. 11/499,285, filed on Aug. 4, 2006, titled "OVERMOLDED SEMICONDUCTOR PACKAGE WITH A WIREBOND CAGE FOR EMI SHIELDING"), International Publication No. WO 2010/014103 (International Application No. PCT/US2008/071832, filed on Jul. 31, 2008, titled "SEMICONDUCTOR PACKAGE WITH INTEGRATED INTERFERENCE SHIELDING AND METHOD OF MANUFACTURE THEREOF"), or some combination thereof. The foregoing publications are hereby expressly incorporated by reference in their entirety. By applying wirebond and other isolation techniques to an RF module, it may be possible to isolate specific subsections of the module by creating a 3D wall between the various subsections. Such a wall may at least partially prevent radiated coupling of RF signals between the various subsections. An isolation wall may consist of both the substrate and bond wires. Depending on the isolation requirement needed by the system, multiple rows of wires can be added.

Figure 8A:
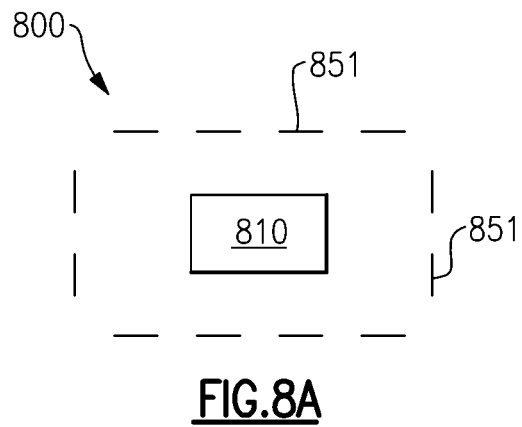
FIGS. 8A-8D show non-limiting example embodiments of wirebonds arranged about active or passive RF devices.

In an example configuration 800 shown in FIG. 8A, an RF device 810 is depicted as being surrounded by a plurality of wirebonds 851 arranged in a rectangular box-shaped pattern. For each side of the rectangle, the wirebonds 851 can be oriented so that planes defined by the wirebonds are generally aligned along the side of the rectangle. The dimensions of each wirebond and spacings between the wirebonds can be selected to provide desired RF isolation functionality.

Figure 8B:
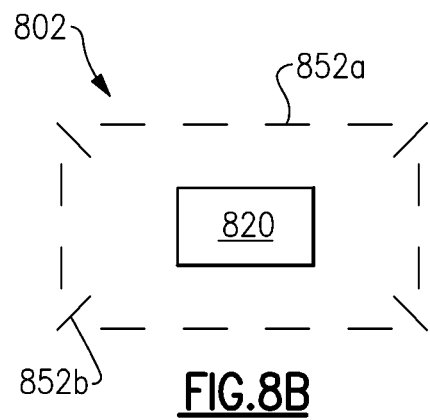

In an example configuration 802 shown in FIG. 8B, an RF device 820 is depicted as being surrounded by a plurality of wirebonds 852a arranged in a rectangular box shaped pattern, similar to the example of FIG. 8A. For each side of the rectangle, a number of wirebonds 852 can be oriented so that planes defined by such wirebonds are generally aligned along the side of the rectangle. Additional wirebonds 852b are shown to be positioned at each of the corners so as to provide a narrower gap between the end wirebonds of the two adjacent sides. In the example shown in FIG. 8B, each of the corner wirebonds is shown to be oriented such that its plane divides the angle defined by the corner. The dimensions of each wirebond, and spacings between the wirebonds, can be selected to provide desired RF isolation functionality.

Figure 8C:
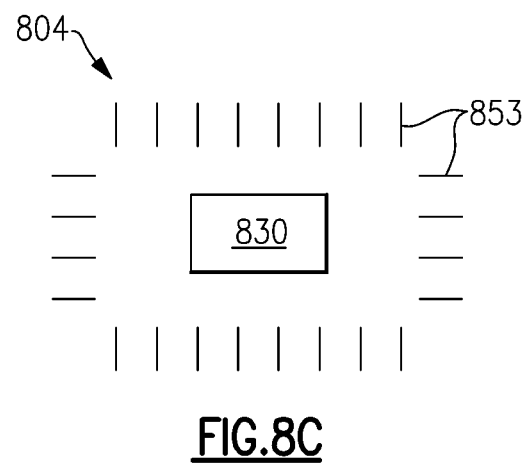

In the example configuration 804 shown in FIG. 8C, an RF device 830 is depicted as being surrounded by a plurality of wirebonds 853 in a rectangular box shaped pattern. For each side of the rectangle, the wirebonds 853 can be oriented so that planes defined by the wirebonds are generally perpendicular to the side of the rectangle. The dimensions of each wirebond and spacings between the wirebonds can be selected to provide desired RF isolation functionality.

Figure 8D:
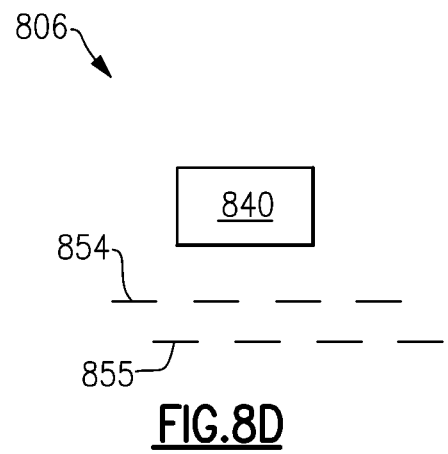

In the examples described in reference to FIGS. 8A-8C, the wirebonds depicted are arranged in a single row at a given side. FIG. 8D shows that in some implementations, more than one row of wirebonds can be provided. In an example configuration 806, first and second rows 854, 855 of wirebonds are shown to be disposed adjacent to an RF device 840. In the example shown, the two rows of wirebonds are staggered so as to provide additional RF isolating capability. The example rows of wirebonds may or may not extend fully around the RF device 840. The dimensions of each wirebond, spacings between the wirebonds in a given row, and spacing between adjacent rows can be selected to provide desired RF isolation functionality.

In some implementations, a given area of a packaged substrate can have more than one wirebond structure. As an example, a first wirebond, such as an arch shaped wirebond similar to that described in U.S. Publication No. US 2007/0241440, can be provided at a given area; a second wirebond similar to that described in International Publication No. WO 2010/014103 can be provided so as to be over and encompassing the first wirebond. These references are hereby incorporated by reference in their entirety into the present disclosure. The first wirebond can be dimensioned so as to fit within an interior space defined by the second wirebond; such dimensions of the first wirebond can be selected to provide an increased RF isolating capability in the interior space of the second wirebond. Various other wirebond configurations may be implemented, as suitable for particular applications.

Figure 9A:
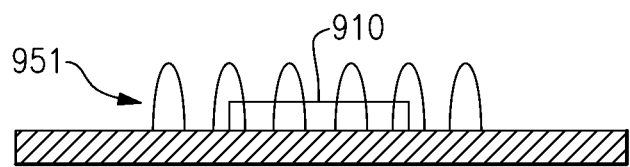
FIGS. 9A-9C show an example sequence of an overmolding process including wirebonds.
Figure 9B:
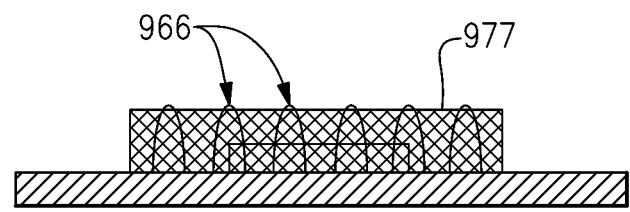
Figure 9C:
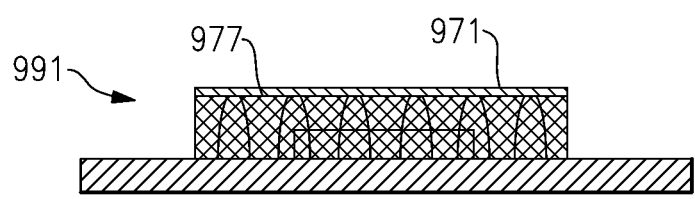

FIGS. 9A-C depict various aspects of structure and methods of wirebond RF isolation. Referring to FIG. 9A, a number of wirebonds 951 are shown to be formed on a substrate layer about or adjacent to an RF device 910. Again, it will be understood that the RF device 910 can be a passive device or an active device as described herein. As illustrated in FIG. 9B, an overmold layer 977 may be formed over one or more of the wirebonds 951, as well as the RF device 910. For the purpose of description of embodiments herein, terms such as "over," "under," "lower," "upper," "top," "bottom," and others are sometimes used in the context of the example orientations of different parts. It will be understood, however, that the packaging process does not necessarily need to be performed in such orientations; thus, such terms are not intended in any manner to limit the various concepts of the present disclosure.

For the purpose of description, a wirebond may include a wire formed from metals such as gold, aluminum or copper. Such metal wires can be dimensioned (e.g., diameter) and configured appropriately so as to allow formation of wirebond structures.

Common wirebonding processes can include, for example, gold ball wirebonding and aluminum wedge bonding. In the context of the example gold ball wirebonding, a gold ball can be formed at the end of a gold wire held by a bonding tool commonly referred to as a capillary which can be part of a wirebonding head assembly. The gold ball, also referred to as a free-air ball, can be formed by a melting process such as an electronic flame-off process. The free-air ball can then be brought into contact with a bonding pad, and an appropriate combination of pressure, heat and/or ultrasonic forces can be applied to the ball for a selected amount of time so as to form the initial metal weld between the wire and the bond pad. The wire can then be dispensed through the capillary.

In some situations, upper portions 966 of wirebonds can remain exposed at the upper surface of an overmold 977 so as to allow electrical connection of the wirebonds with a conductive layer (971 in FIG. 9C), which is discussed in greater detail below. However, in some situations, the upper portions 966 of the wirebonds may become buried within the overmold 977 during the molding process, or only a small number of such upper portions may be exposed. In such situations, an upper portion of the overmold 977 can be removed so as to expose a greater number of the upper portions 966 of the wirebonds. Such removal of the overmold's upper portion can be achieved in a number of ways, including laser abrasion, mechanical milling, diamond polishing, etc.

FIG. 9B shows an example result of such a removal process, where a new upper surface 977 can be formed so as to expose more or all of the upper portions (depicted as 966) of the wirebonds. In FIG. 9C, a conductive layer 971 is depicted as being formed or disposed on an upper surface of the overmold 977 so as to make electrical contacts with the upper portions 966 of the wirebonds.

While the illustrated embodiment depicts a plurality of wirebond structures connecting the conductive top layer 971 with a ground plane (not shown), certain embodiments include fewer or more conductive paths connecting the top layer to ground. For example, a single wall or connection point may provide a relatively strengthened ground plane, thereby improving interference attenuation. In cases including few or sparsely populated walls/connection points, EMI shielding may be less effective due to lack of complete Faraday containment. Therefore, in certain embodiments, wirebond structures are advantageously disposed within a close enough proximity to effectively provide 3D interference blocking.

Use of wirebonds for EMI shielding, as opposed to, for example, metal cans, may provide cost advantages associated with material and/or manufacturing costs. In addition, metal can embodiments may also present spacing disadvantages, wherein module size may prevent or impede desirable isolation. In certain embodiments, wirebond shielding utilizes less physical space than certain metal can shielding techniques.

Figure 10:
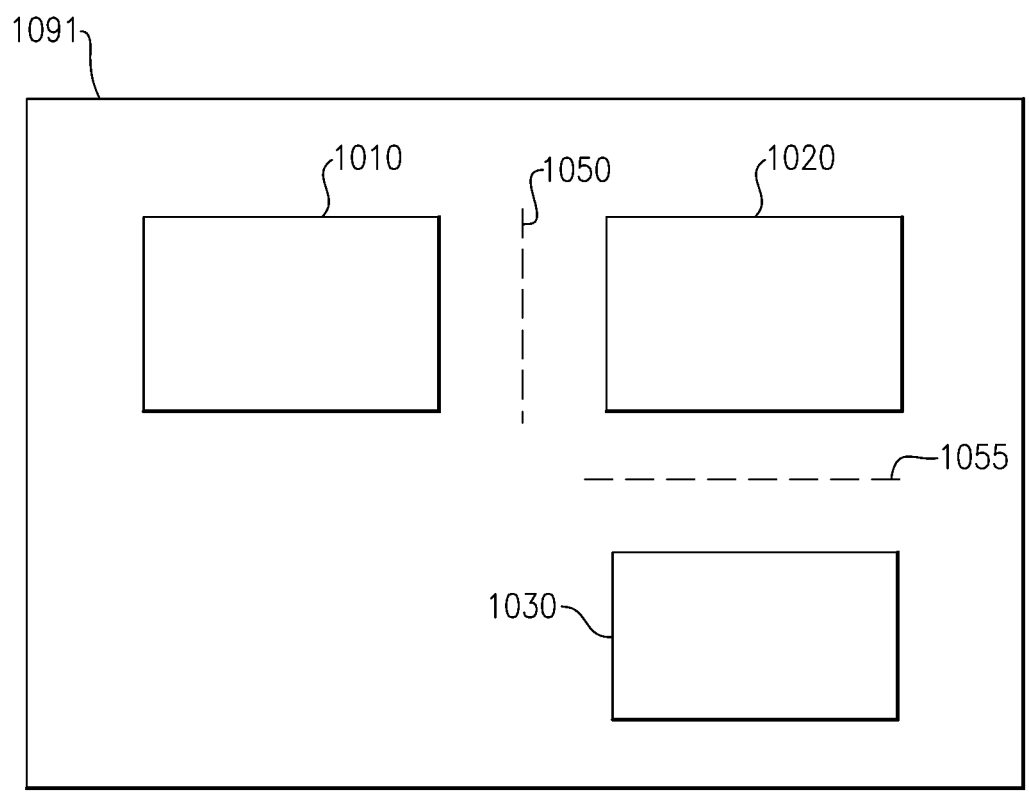
FIG. 10 schematically depicts an embodiment of an electronic device having a plurality of RF devices with wirebond structures in an example arrangement.

FIG. 10 illustrates a block diagram of a wireless module 1091 including a plurality of RF devices, 1010, 1020 and 1030. In certain embodiments, the wireless module 1091 includes one or more wirebond structures, or rows of wirebond structures 1050, 1055 disposed at least partially between two or more of the RF devices 1010, 1020, 1030. For example, as shown, wirebond row 1050 is positioned between devices 1010 and 1020. Wirebond row 1050, possibly in combination with one or more top, ground, or other conductive layers, may at least partially form an RF barrier between devices 1010 and 1020. For example, wirebond row 1050 may assist in attenuating, impeding, or substantially eliminating unwanted RF signal bleeding between the devices 1010, 1020. Therefore, the wirebond structures 1050 provide 3D shielding between a plurality of RF devices disposed on a single substrate. For example, in an embodiment where a channel between device 1010 and device 1030 desirably allows for transmission of data or power between the devices 1010 and 1030, interference with such transmission may be at least partially blocked by one or both of the wirebond rows 1050, 1055. In certain embodiments, wirebond rows may lie along substantially straight lines, and may be substantially perpendicular in relative alignment, as shown.

Figure 11:
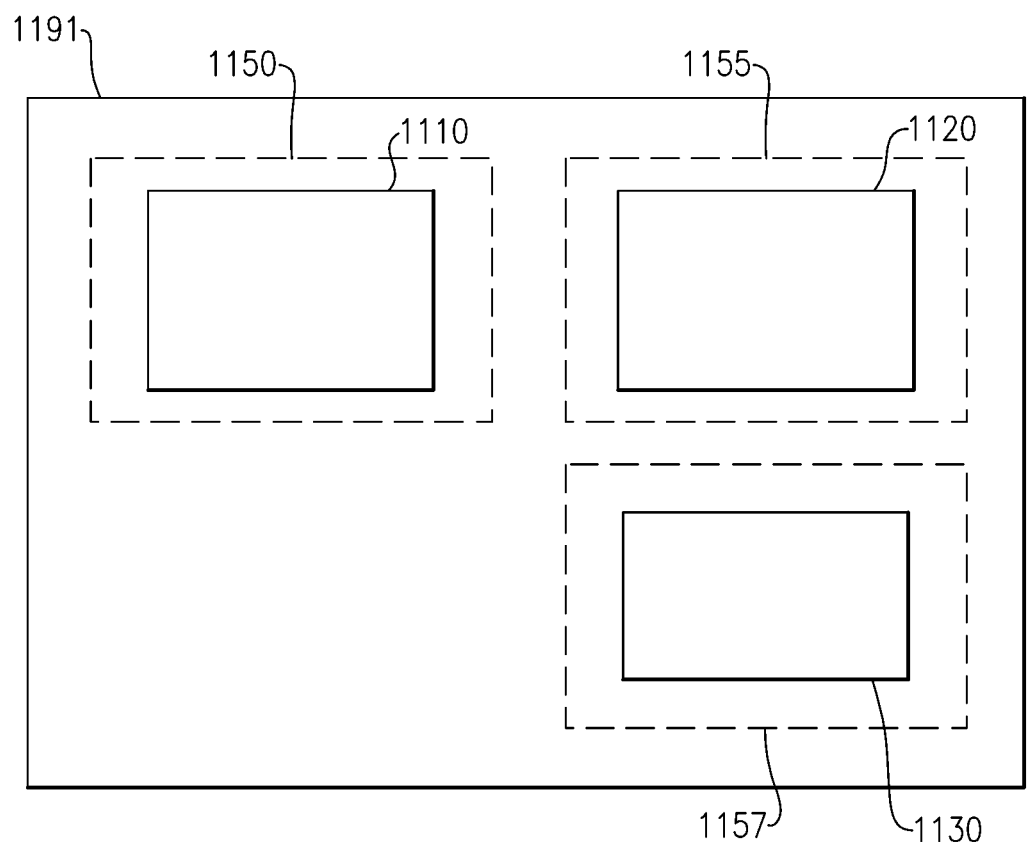
FIG. 11 schematically depicts an embodiment of an electronic device having a plurality of RF devices with wirebond structures in an example arrangement.

FIG. 11 illustrates a block diagram of a wireless module 1191 including a plurality of RF devices 1110, 1120, and 1130. In certain embodiments, the wireless module 1191 includes one or more wirebond structures, or rows of wirebond structures 1150, 1155, 1157 for at least partially isolating one or more of the RF devices 1110, 1120, 1130 from one another, or from external influences. As shown in the embodiment of FIG. 11, RF isolation structure, such as wirebonds 1150, may fully or partially surround one or more devices disposed on a single substrate or module. For example, RF isolation structure 1150 may comprise a row, or collection of rows, of wirebond structures configured such that substantially all portions of the RF device 1110 are shielded from external signals. Similar shielding structure may be configured around some or all of one or more other devices 1120, 1130 disposed within the module 1191.

Figure 12:
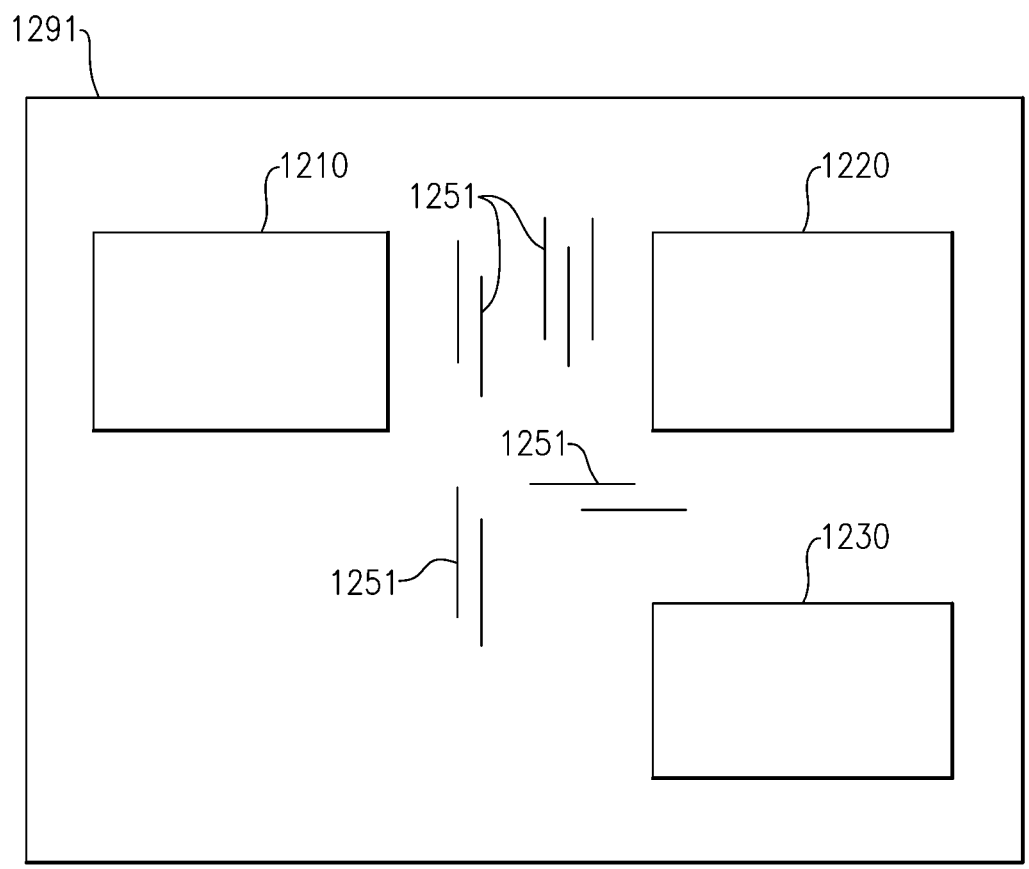
FIG. 12 schematically depicts an embodiment of an electronic device having a plurality of RF devices with wirebond structures in an example arrangement.

FIG. 12 illustrates a block diagram of an electronic device 1221 including a plurality of RF devices 1210, 1220, 1230 disposed thereon. In certain embodiments, the electronic device 1291 includes one or more wirebond structures, or rows of wirebond structures 1251 for at least partially isolating one or more of the RF devices 1210, 1220, 1230 from one another, or from external influences. The wirebond structures 1251 may be arranged in some configuration designed to impede the transmission of interference between the devices. For example, the wirebond structures 1251 illustrated may be configured to isolate the device 1210 from both the device 1220 and the device 1230. The wirebond structures may take the form of staggered wire wickets having openings configured to prevent propagation of electromagnetic interference therethrough. Although the wirebonds 1251 are illustrated disposed in the configuration shown, they may be disposed in any suitable or desirable arrangement or layout. For example, additional wirebonds may be disposed between the devices 1220 and 1230.

Figure 13A:
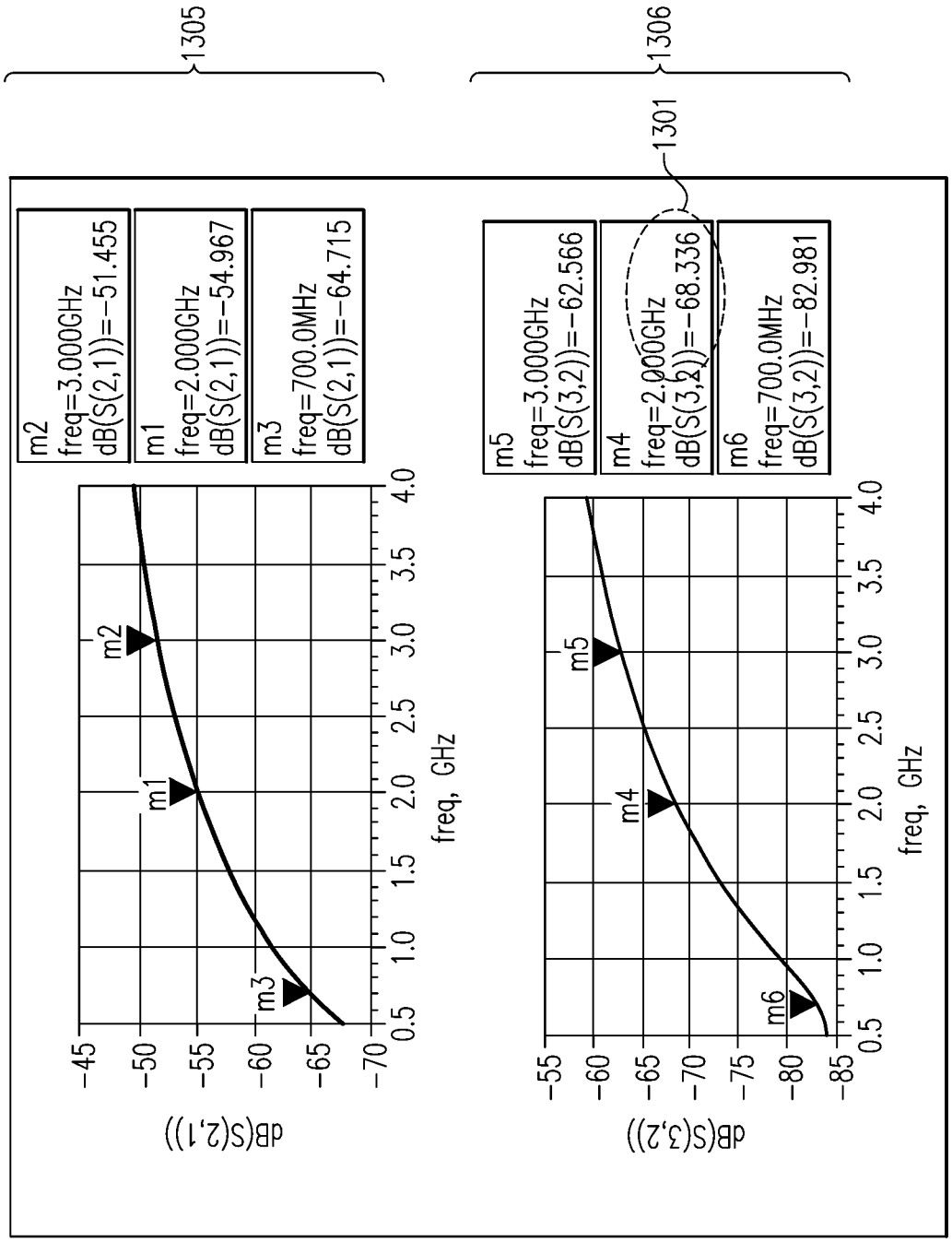
FIGS. 13A-13B provide graphical examples of RF isolation data associated with embodiments disclosed herein.
Figure 13B:
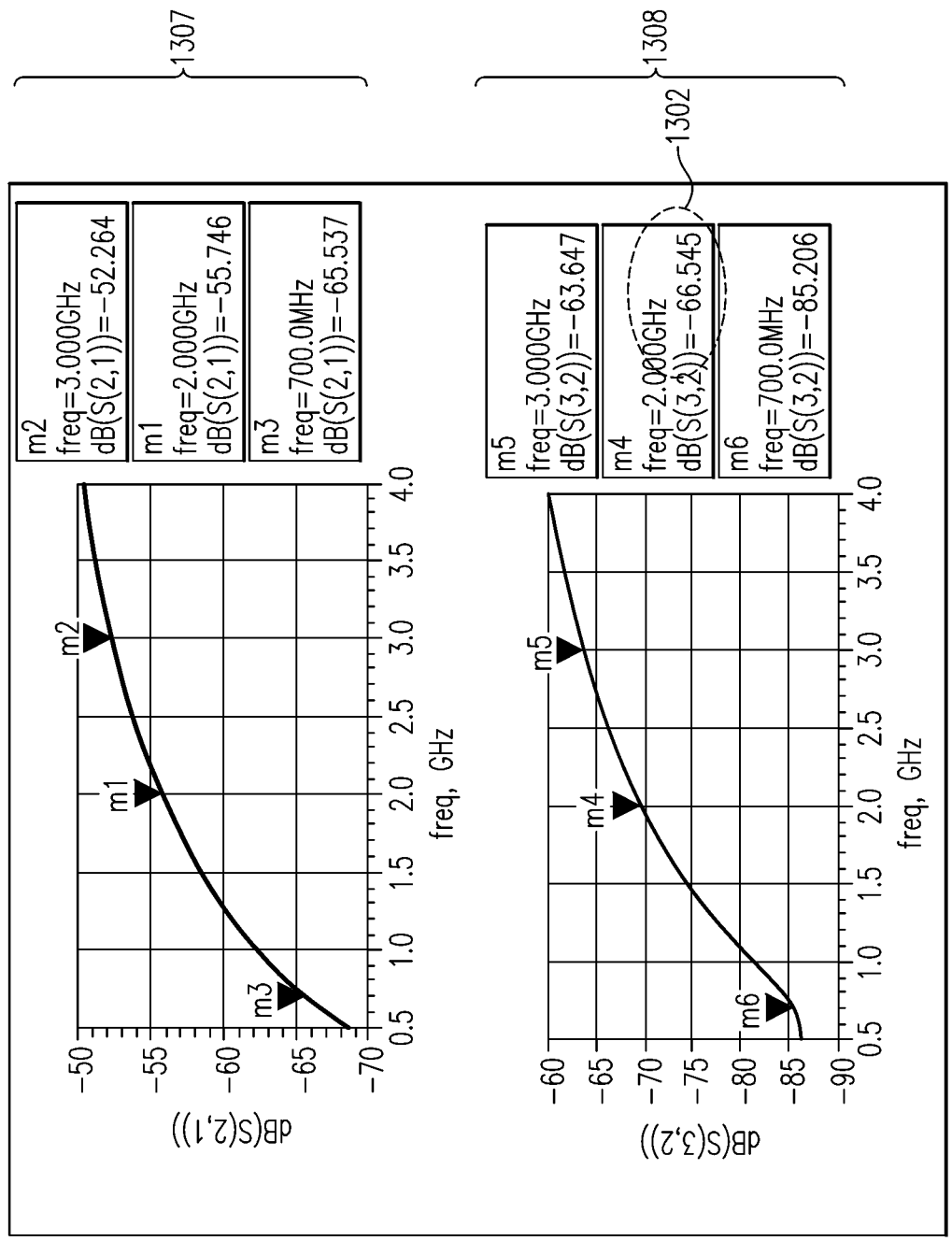

FIGS. 13A-B provide example graphical RF isolation data associated with embodiments disclosed herein. The graph of FIG. 13A represents potential interference data that may be associated with an RF device similar to that shown in FIG. 12, without wirebonds 1251 disposed thereon. FIG. 13B, in contrast, provides potential RF interference data for a device similar to that shown in FIG. 12, including wirebond isolation structure 1251 disposed thereon. Each of the two figures provides a graph representing interference between devices 1220 and 1210 (1321a, 1321b), as well as a graph representing interference between devices 1230 and 1220. The data associated with the graphs is shown on the right side of the page (1305, 1306, 1307, 1308). As shown in the figures, introducing wirebond structures like that shown in FIG. 12 may provide improvements in interference shielding by approximately 1 dB or more in certain embodiments. For example, the data shown describes interference attenuation of approximately −68.3 dB at 2.0 GHz (see 1306) for an embodiment without the wirebond structures, and interference attenuation of approximately −69.5 dB at the same frequency with the wirebond structures.

Figure 14A:
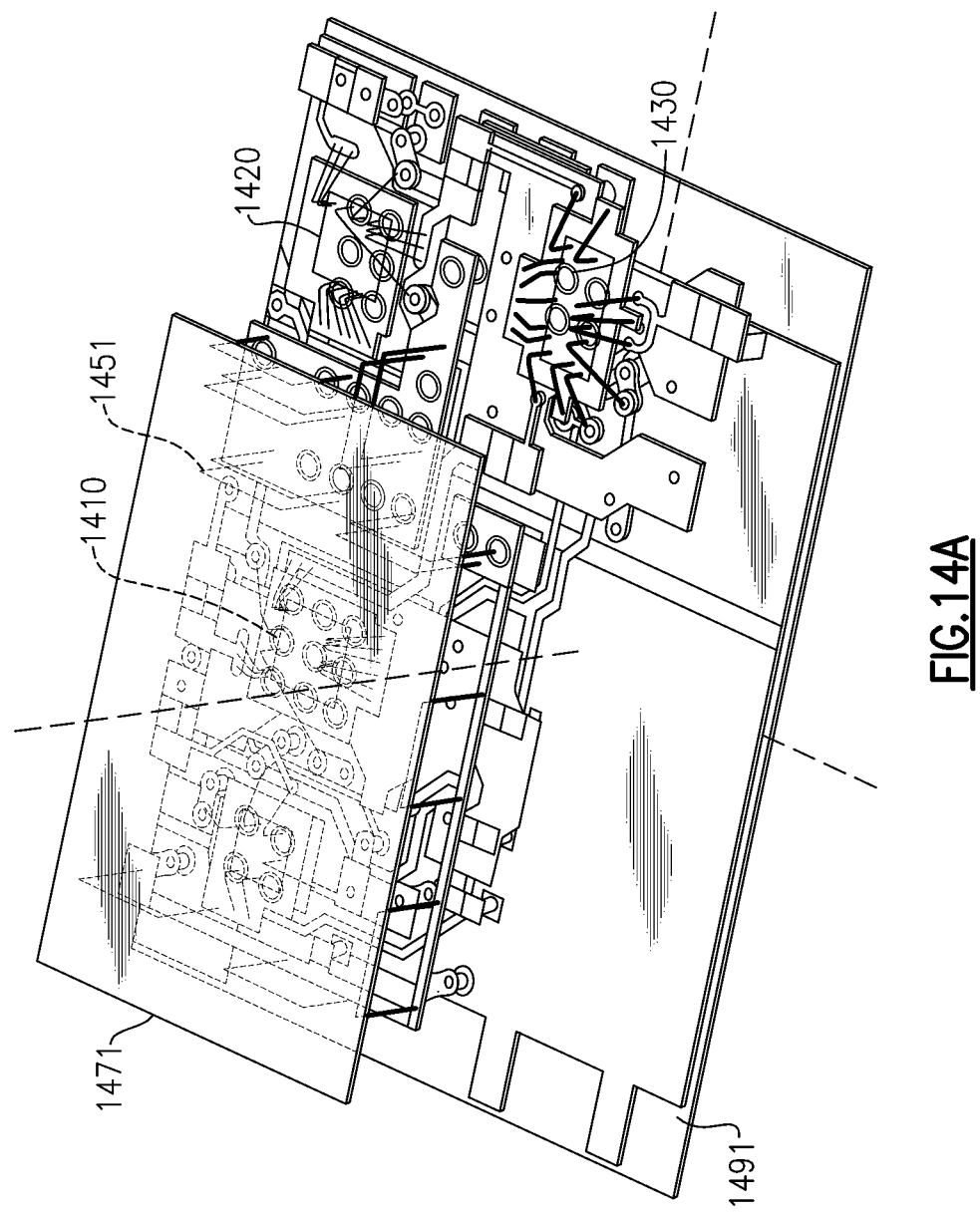
FIG. 14A depicts an embodiment of an electronic device having a plurality of RF devices and a conductive top layer.

Although FIGS. 13A and 13B demonstrate improved performance with regard to interference attenuation for a packaged component utilizing wirebond isolation structures, adding wirebond structures as described herein between devices is not the only method disclosed herein for improved RF isolation between regions or devices disposed on a single substrate. In certain embodiments, wirebond concepts disclosed herein may be combined with one or more other RF-shielding methods or mechanisms to greatly improve shielding performance. FIG. 14A illustrates an embodiment of a packaged component having a conductive layer 1471 disposed above one or more RF devices on a substrate situated on an overmold (not shown in FIG. 14A). The conductive layer may comprise conductive plating or paint disposed above a top surface of a substrate. The conductive layer 1471 may be situated over a device 1410, as well as various bond pads, wirebonds 1451, and at least a portion of the substrate 1491. In certain embodiments, the conductive layer 1471 can comprise a conductive coating, such as a conductive ink or paint, which can include copper, silver, or other conductive metals. In another embodiment, conductive layer 1471 can comprise a layer of copper, aluminum, or other suitable metal.

In an embodiment in which the conductive layer 1471 comprises a layer of metal, the layer of metal can be deposited on top surface of an overmold, like overmold 977 shown in FIG. 9B, and on exposed center portions of wirebonds, like the exposed wirebond portions 966. The conductive layer 1471 may be deposited by utilizing a chemical vapor deposition (CVD) process or other suitable deposition processes. In certain embodiments, conductive layer 1471 is a highly conductive coating that can be utilized in high volume, precise spray applications on circuit boards and semiconductor packages. Such coating may at least partially provide board-level or package-level EMI shielding of electrical components. Certain embodiments utilize a conductive paint layer 1471 in place of stamped metal cans, wherein use of the conductive paint rather than metal cans for EMI shielding provides reduced board space occupation and reduced cost of board-level EMI shielding. In certain embodiments, the conductive layer is a silver-filled polyurethane paint coating.

Figure 14B:
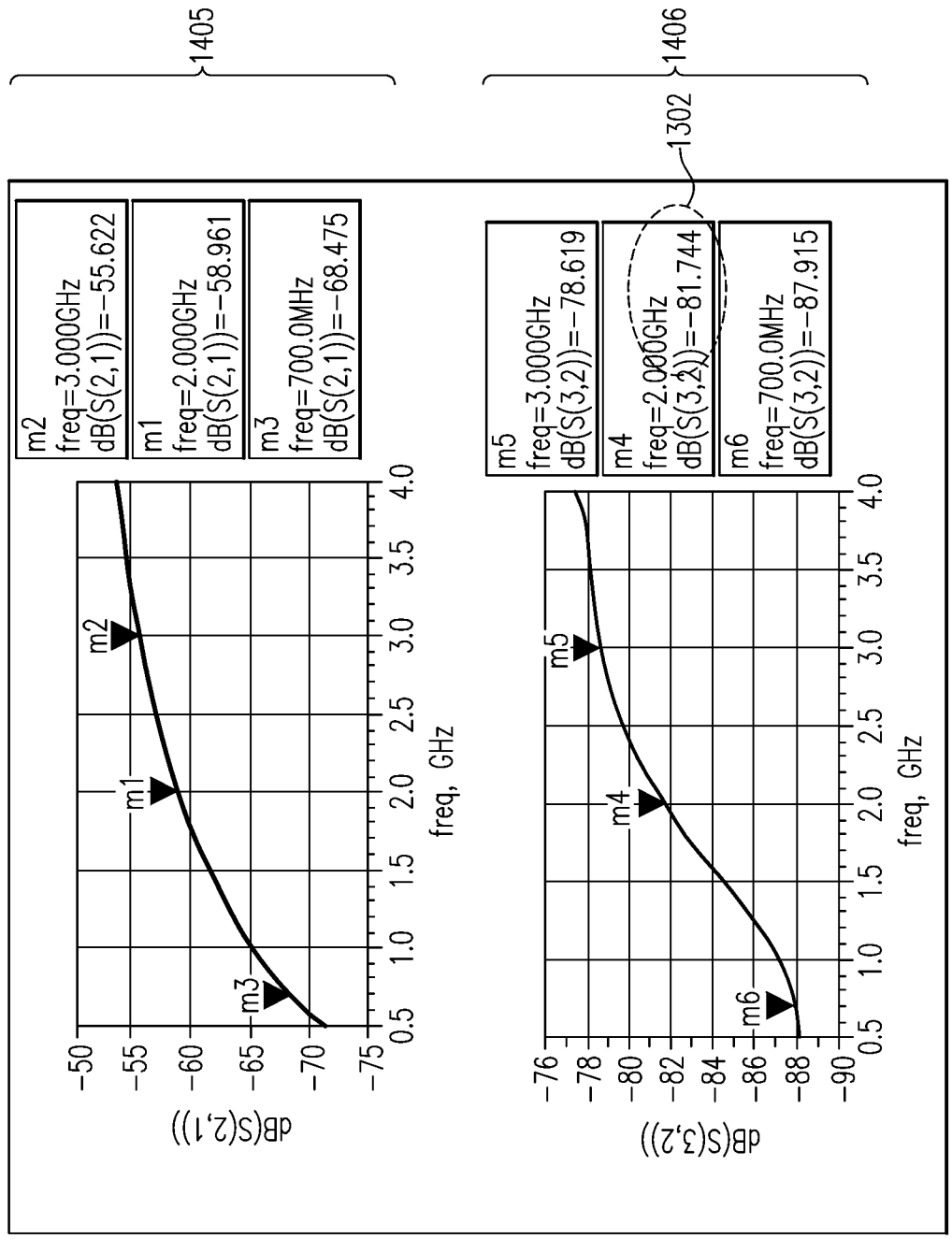
FIG. 14B provides graphical examples of RF isolation data associated with the embodiment of FIG. 14A.

FIG. 14B provides data demonstrating potential increase in RF isolation performance of a device utilizing wirebonds and an upper conductive layer over one or a plurality of devices disposed on a single substrate. The figure provides a graph representing interference between devices 1420 and 1410, as well as a graph representing interference between devices 1430 and 1420 of FIG. 12. The data associate with the graphs is shown on the right side of the page (1405, 1406). As shown in the figures, introducing a conductive top layer above one of the devices, like that shown in FIG. 14A may provide improvements in interference shielding by approximately 10-15 dB or more relative to a device with no conductive top layer. For example, the data shown describes interference attenuation of approximately −81.744 dB at 2.0 GHz (see 1406).

Segmented Conductive TOP Layer

Figure 15:
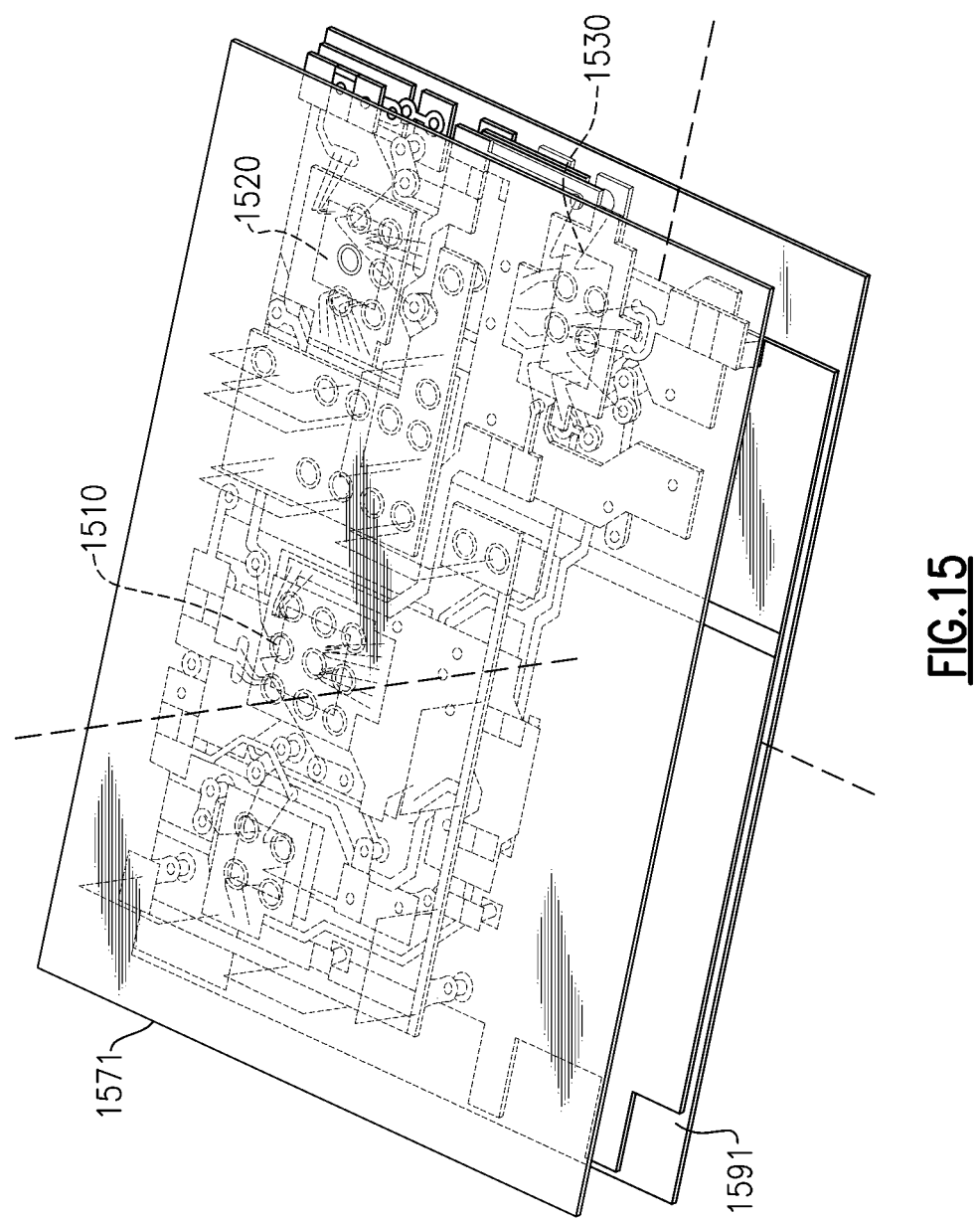
FIG. 15 depicts an embodiment of an electronic device having a plurality of RF devices and a conductive top layer.

FIG. 15 illustrates an embodiment of a packaged component 1591 including a plurality of RF devices disposed thereon (1510, 1520, 1530). The packaged component 1500 includes a conductive top layer 1571 covering a region of the substrate 1591 above more than one RF device. As described above, the presence of the top conductive layer 1571 may provide various benefits associated with RF shielding. However, in certain embodiments, the presence of a singular, continuous top conductive layer 1571 extending over an area covering separate RF devices can lead to some amount of harmonic interference between the devices over the conductive top layer. Therefore, it may be desirable to reduce such harmonic interference by at least partially isolating portions of the top conductive layer 1571 from one another. For example, gaps or breaks in a conductive layer may impede mobility of free carriers from one region of the conductive layer to another.

Gaps or breaks in a conductive layer may be formed in any suitable or practical manner. For example, a conductive layer may be cut using saw or laser. In certain embodiments, a top conductive layer is cut to a depth of approximately 20-30 µm. Such cutting may penetrate into a substrate disposed below the conductive layer. It may be advantageous to implement such cutting without burning the conductive layer. Furthermore, the sides of the conductive layer created through cutting may advantageously be substantially straight.

FIGS. 16A-F illustrate examples of top conductive layer embodiments in which the top layer is patterned into subsections in order to at least partially isolate one subsection from another. In certain embodiments, each subsection, or one or more subsections, of a top conductive layer includes its own separate path to ground with respect to other subsections. Such separation, or isolation, can greatly reduce inter-device interference in a packaged component. The various reference numbers beginning with 1671 identify different subsections of the various top players illustrated. Each of the illustrated embodiments includes one or more breaks or gaps in the conductive layer (1601-1606) which serve to isolate subsections from one another. Such gaps or breaks are formed in any suitable manner. For example a top conductive layer may be subjected to etching, or laser ablation, wherein voids or gaps are formed according to a desired configuration or arrangement.

Figure 16A:
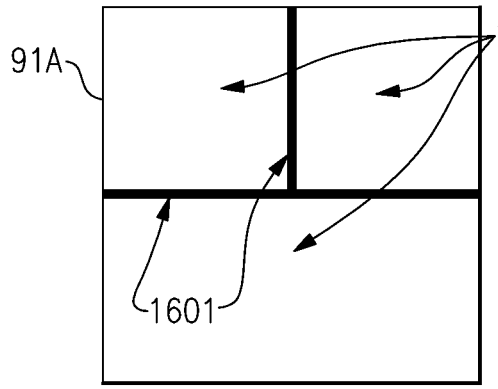
FIGS. 16A-16F provide embodiments of conductive to or ground layer isolation techniques.
Figure 16B:
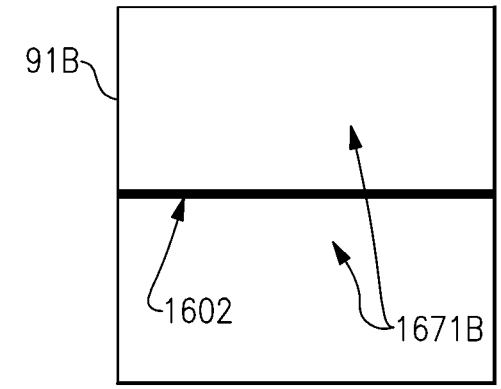
Figure 16C:
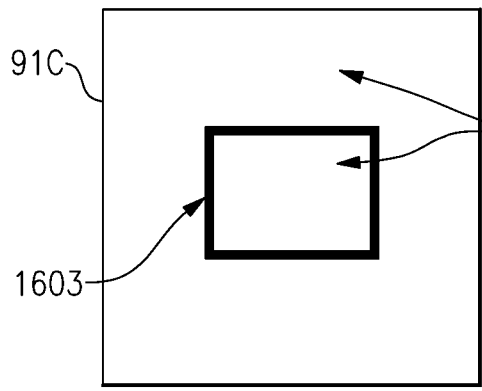
Figure 16D:
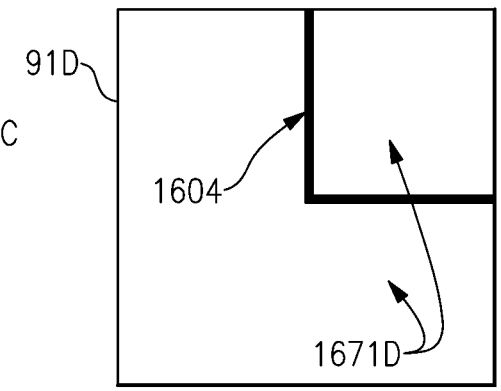
Figure 16E:
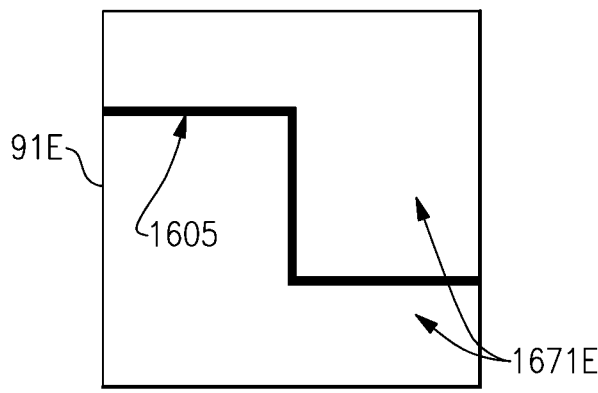
Figure 16F:
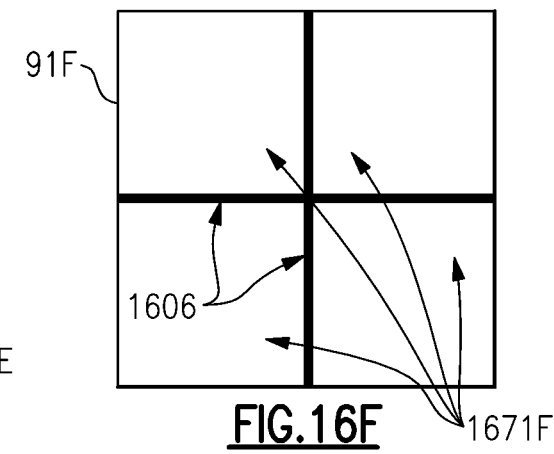

As shown, the embodiment of FIG. 16A includes three distinct subsections 1671A separated by one or more gaps 1601. FIG. 16B illustrates an embodiment in which a top conductive plane is separated into two subsections 1671B. In certain embodiments, the various subsections may be of uniform shape or area, such as that shown in FIG. 16B. In certain embodiments, it may be desirable to isolate a particular RF device or devices by creating an isolating perimeter 1603 around at least a portion of the device, as shown in FIG. 16C. FIG. 16D likewise demonstrates an embodiment in which a particular subsection is isolated from the remainder of the top conductive layer. However, in some embodiments, it is not necessary to create a perimeter of isolation around the device where a region associated with the device effectively abuts an outside surface of the packaged component. As shown in FIG. 16E, RF isolation gaps in conductive layers may take any desirable shape or form, depending on the device and/or specifications to which it is suited. As shown in FIG. 16F, a conductive layer may include a number of subsections, such as four or more discrete subsections 1671F, in order to advantageously provide relative isolation for a number of RS devices or components.

Segmented Reference Plane

As described above, a packaged component including a plurality of RF devices may comprise one or more ground/reference potential planes (e.g., constant DC plane) disposed beneath one or more RF devices. While an electrical ground plane may provide common electrical potential for one or more devices of the packaged component, similarly to the conductive top layer discussed above, a conductive crown layer may, in certain embodiments, facilitate the movement of free carriers between RF devices when multiple RF devices share a single ground plane. Therefore, ground plane isolation may provide yet another mechanism by which inter-device RF interference can be reduced.

Certain RF modules are sensitive to sharing a common ground; it may be desirable to avoid conductive coupling within the shared ground path. For example, a module may require separate analog and digital ground planes. Another possibility is that a single module has multiple RF (Radio frequency) paths. This can occur, for example, in 3/4G cell phones that contain multiple frequency bands. These paths may need to be substantially or completely isolated away from each other. One approach, as described herein, is to isolate the ground paths for each path so that the possibility of cross coupling is reduced.

The amount of potential EMI power pulled to ground may depend on how strong ground is. Separation of subsections of conductive top and/or ground planes can improve grounding properties of a packages substrate. In order to prevent/reduce conductive coupling within the shielded module, separation of one of the substrate ground or top layers may not be adequate, wherein other conductive layers are shared. By patterning the top conductive layer and ground layer into specific subsections, more complete isolation of separate conductive paths within a module may be achieved. In certain embodiments, each subsection comprises its own separate path to ground.

With respect to packages modules disposed in wireless devices, separate conductive/ground layers may eventually combine. In general, the greater the degree of separation between conductive layers, the better the resulting isolation.

However, EMI shielding using methods disclosed herein (i.e., wirebond formation, separation of top conductive layer, separation of ground layer) can present certain associated costs to be considered. Therefore, the mechanisms and techniques described herein may be combined or utilized in order to achieve a desired level of isolation, while providing a solution that also meets particular cost considerations. The various techniques may be added and/or adjusted in a system to effectively tune the isolation properties of the module to meet implementation needs. For example, in an embodiment, a module may include wirebond structures as well as either subdivided top or ground layers, but not both, wherein the resulting isolation of the devices of interest is sufficient to meet module specifications. By not implementing all three techniques, manufacturing costs may be saved. As another example, a packaged module may include subdivided top and ground layers, but no wirebond shielding. Alternatively, a module may incorporate a single technique described herein individually. If such embodiments provide adequate isolation, they may be suitable or desirable options rather than full isolation including all techniques described herein.

Figure 17:
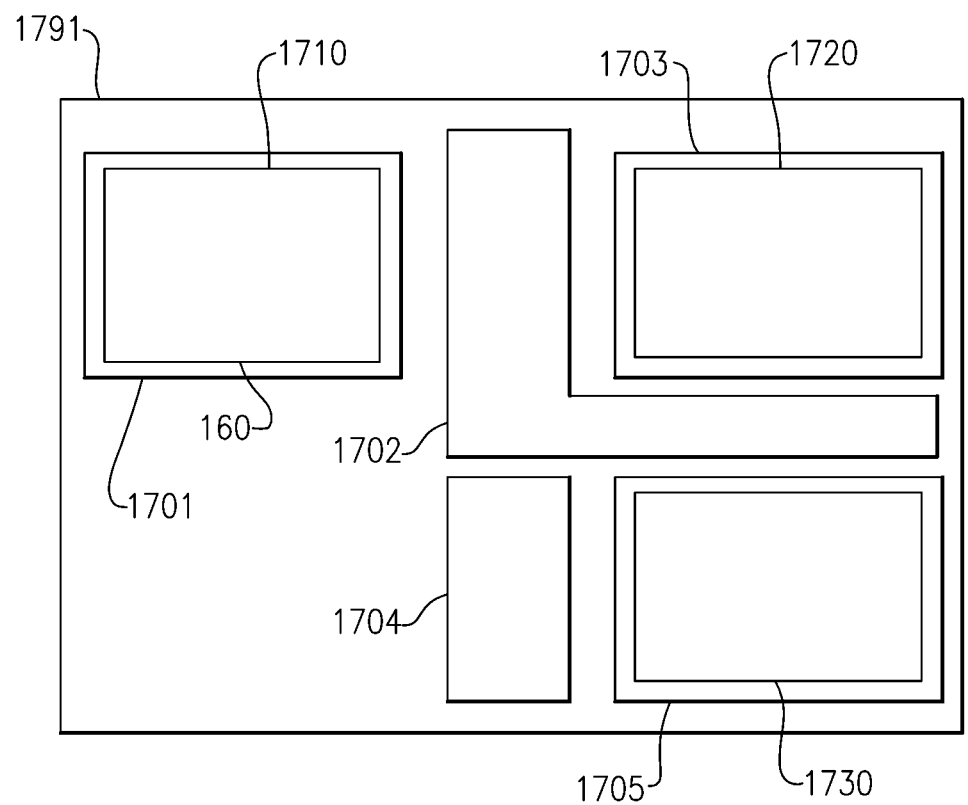
FIG. 17 depicts an embodiment of an electronic device having a plurality of RF devices and a plurality of conductive ground layers.

A ground plane of a packaged component may be divided into subsections or regions in any suitable manner, such as is described above with respect to isolation of conductive top layers in FIGS. 16A-F. For example, separate RF devices may each be disposed above separate ground planes, such as one ground plane per RF device. In certain embodiments, additional ground plane subsections are also present. FIG. 17 illustrates an embodiment of a layout of a packaged component comprising a plurality of RF devices (1710, 1720, 1730). As shown in the figure, each of the RF devices has associated therewith a separate ground plane (1701, 1702, 1703). Furthermore, the depicted embodiment comprises additional ground planes 1704, 1705.

As described above, ground plane segmentation may be utilized with or without corresponding top layer segmentation. In certain embodiments, a top conductive layer is patterned in a similar pattern as a ground plane, wherein separate subsections of top conductive layer correspond to separate subsections of conductive ground plane.

Figure 18:
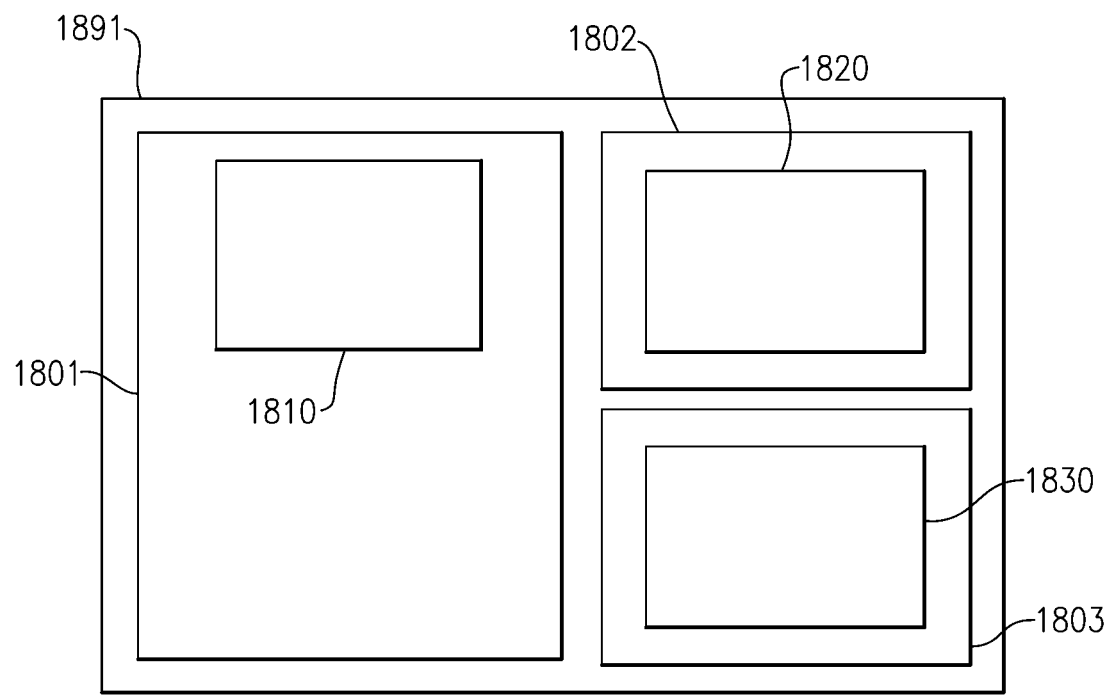
FIG. 18 depicts an embodiment of an electronic device having a plurality of RF devices and a plurality of conductive ground layers.
Figure 19:
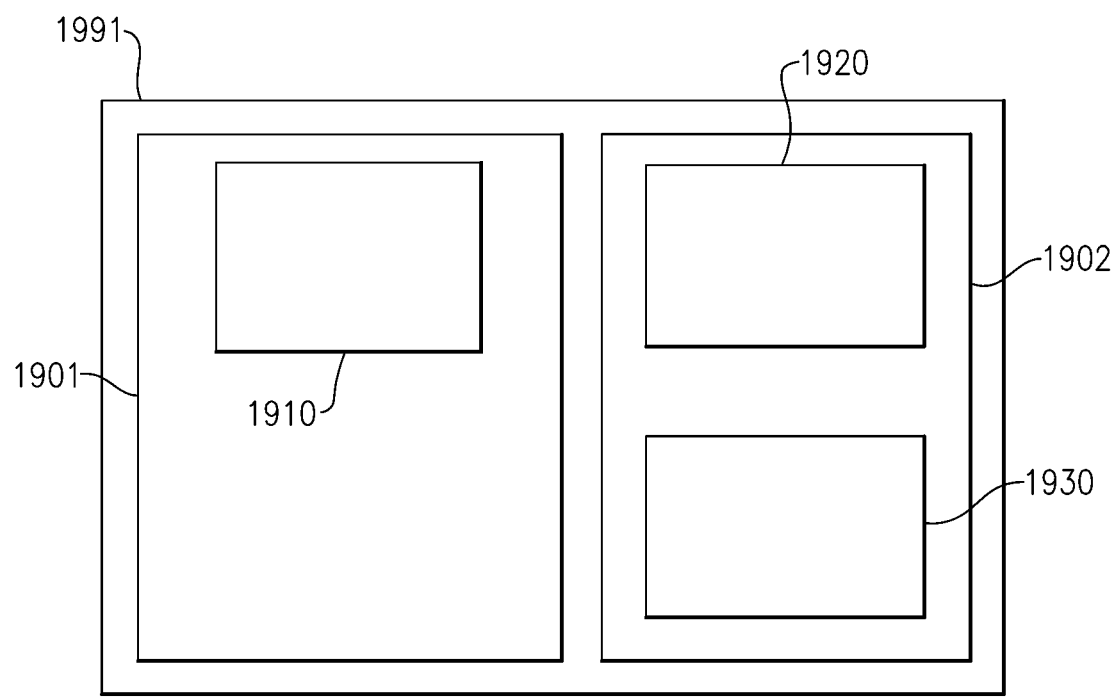
FIG. 19 depicts an embodiment of an electronic device having a plurality of RF devices and a plurality of conductive ground layers.

In certain embodiments, as is shown in FIG. 18, a separate ground plane 801 may extend substantially beyond the perimeter of an RF device 1810 electrically coupled thereto. Indeed, ground planes may occupy any desirable shape or space. Furthermore, as shown in FIG. 19, a single subsection of a ground plane may be electrically coupled to a plurality of RF devices. For example, in certain embodiments, it may be of particular interest to isolate a first device 1910 from neighboring devices 1920 1930. Therefore, as shown in FIG. 19, a first separate ground plane may be associated with the first device, and a second with one or more other RF devices.

Figure 20:
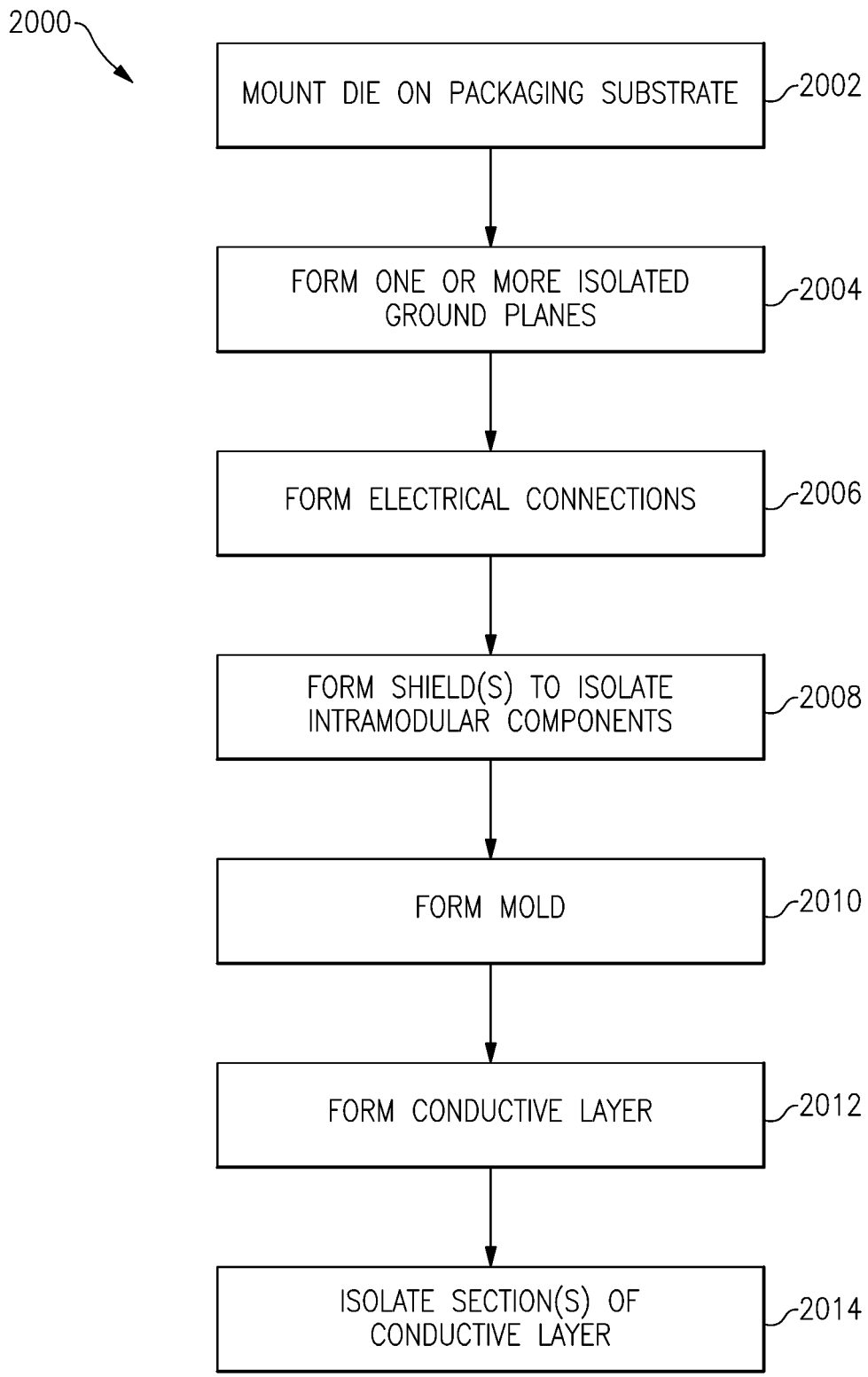
FIG. 20 illustrates a process for providing RF isolation between a plurality of electronic devices.

FIG. 20 provides a flowchart for a process of electrically isolating a plurality of devices disposed in a single package substrate. Although the various blocks of the process 2000 are illustrated in a particular order, such order is provided for convenience only, and the steps of the process 2000 may be performed in any desirable manner and still fall within the scope of the present disclosure. The process 2000 may include mounting one or more dies on a packaging substrate. As shown in the figure, this step is performed at block 2002. The dies may be separate RF devices configured to be disposed on a single packaging substrate. The process 2000 further includes forming one or more isolated ground planes. The ground planes, as described above, may be associated with various dies or devices disposed on the packaging substrate, providing a voltage reference point to one or more of the devices disposed on the packaging substrate. The formation of ground planes is performed at block 2004. One or more electrical connections may be formed between dies mounted on the packaging substrate and the one or more isolated ground planes, as depicted in block 2006.

Three-dimensional isolation between dies mounted on the packaging substrate may also be formed or disposed in the packaging substrate at block 2008. As described above, such isolation structure may take the form of one or more wire bonds configured to provide shielding from RF interference. At block 2010, a mold is formed around one or more components disposed on the packaging substrate.

A top surface of the mold may have a conductive layer disposed thereon, such as a conductive top layer as described above. At block 2014, at least a portion of the conductive layer formed at block 2012 is subdivided into subsections of the conductive layer, wherein the isolated subsections are separated or divided by some type of conduction-inhibiting matter or physical gap. For example, such isolation may be achieved through etching or the like of the top conductive layer. Electronic devices constructed according to the process 2000 may advantageously achieve inter-device interference shielding, thereby improving aspects of the operation of the device.

Embodiments disclosed herein may provide the ability to isolate sensitive subsection within a module in order to minimize conductive coupling within the module. Furthermore, various techniques described herein (i.e., wirebond formation, separation of top conductive layer, separation of ground layer) may be selectively chosen in order to tune isolation properties of the module to meet system requirements. Effectively, the present disclosure allows for custom tailoring of EMI isolation vis-à-vis performance, cost, space, and/or other considerations.

Shielded modules described herein may achieve EMI shield having a low manufacturing cost compared to a conventional prefabricated metal shield. Additionally, the conductive layer described herein may be significantly thinner than metal utilized to form conventional prefabricated metal can shielding. Therefore, the resulting EMI shield may comprise a thinner overmolded package compared to an overmolded package that includes a conventional prefabricated metal can.

While various embodiments of RF isolation have been described, it will be apparent to those of ordinary skill in the art that many more embodiments and implementations are possible. For example, embodiments of RF isolation structures and techniques are applicable to different types of devices (e.g., power amplifiers, now-noise amplifiers, switches, passive devices, etc.) and are applicable to any device circuitry. In addition, embodiments of RF isolation structures are applicable to systems where cross-device interference attenuation is desired.

Some of the embodiments described herein can be utilized in connection with wireless devices such as mobile phones. However, one or more features described herein can be used for any other systems or apparatus that utilize of RF signals or can be susceptible to RF signals or noises.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
   a substrate;
   a first radio frequency (RF) devices mounted on a surface of the substrate;
   a second radio frequency (RF) devices mounted on a surface of the substrate in a side-by-side configuration with respect to the first RF device;
   a first conductive ground layer disposed at least partially below the first radio frequency device;
   a first plurality of wirebond structures disposed on the substrate between the first radio frequency device and the second radio frequency device;
   a molding dimensioned to encapsulate at least a portion of the first and second radio frequency devices and at least a portion of the first plurality of wirebond structures; and
   a first conductive top layer disposed at least partially above the first radio frequency device and in electrical contact with one or more of the first plurality of wirebond structures such that the first conductive ground layer, the one or more of the first plurality of wirebond structures, and the first conductive top layer at least partially form a radio frequency barrier between the first radio frequency device and the second radio frequency device.

2. The apparatus of claim 1 wherein a first portion of the first plurality of wirebond structures forms a first row between the first and second radio frequency devices.

3. The apparatus of claim 2 wherein a second portion of the first plurality of wirebond structures forms a second row, substantially parallel to the first row.

4. The apparatus of claim 1 further comprising a third radio frequency device mounted on the surface of the substrate.

5. The apparatus of claim 4 wherein the first and second radio frequency devices are each electrically connected to the third radio frequency device.

6. The apparatus of claim 5 wherein the first radio frequency device includes a first switching device, the second radio frequency device includes a second switching device, and the third radio frequency device includes an amplifier device.

7. The apparatus of claim 4 further comprising a second plurality of wirebond structures disposed on the surface of the substrate between the first radio frequency device and the third radio frequency device, at least partially forming a radio frequency barrier between the first and third radio frequency devices.

8. The apparatus of claim 7 further comprising a third plurality of wirebond structures disposed on the surface of the substrate between the second radio frequency device and the third radio frequency device, at least partially forming a radio frequency barrier between the second and third radio frequency devices.

9. The apparatus of claim 7 wherein at least some of the first plurality of wirebond structures forms a first row between the first and second radio frequency devices, and at least some of the second plurality of wirebond structures forms a second row between the first and third radio frequency devices, the second row being disposed at a substantially right angle with respect to the first row.

10. A method of providing RF shielding for a plurality of devices, said method comprising the steps of:
    providing a substrate;
    mounting a first RF device on a surface of the substrate;
    mounting a second RF device on the surface of the substrate beside the first RF device;
    disposing a first plurality of wirebond structures on the substrate between first and second devices of the plurality of radio frequency devices; and
    electrically connecting the first plurality of wirebond structures between a conductive top layer and a conductive ground layer such that the first plurality of wirebond structures, at least a portion of the conductive top layer, and at least a portion of the conductive ground layer at least partially form a radio frequency barrier between the first device and the second device.

11. The method of claim 10 wherein disposing the first plurality of wirebond structures on the substrate comprises forming a first row of wirebond structures between the first and second devices.

12. The method of claim 11 wherein disposing the first plurality of wirebond structures on the substrate further comprises forming a second row of wirebond structures between the first and second devices, the second row being substantially parallel to the first row.

13. The method of claim 10 wherein the plurality of radio frequency devices includes a third device.

14. The method of claim 13 further comprising electrically connecting the first and second devices to the third device.

15. The method of claim 14 wherein the first device includes a first switching device, the second device includes a second switching device, and the third device includes an amplifier device.

16. The method of claim 13 further comprising disposing a second plurality of wirebond structures on the substrate between the first device and the third device, the second plurality of wirebond structures at least partially forming a radio frequency barrier between the first and third devices.

17. The method of claim 16 further comprising disposing a third plurality of wirebond structures on the substrate between the second device and the third device, the third plurality of wirebond structures at least partially forming a radio frequency barrier between the second and third radio frequency devices.

18. The method of claim 16 wherein at least some of the first plurality of wirebond structures forms a first row between the first and second devices, and at least some of the second plurality of wirebond structures forms a second row between the first and third devices, the second row being disposed at a substantially right angle with respect to the first row.

19. A wireless device comprising:
a first antenna;
a second antenna;
a radio frequency (RF) module including a first switching device electrically coupled to the first antenna and a second switching device separated from the first switching device by a lateral space and electrically coupled to the second antenna;
a conductive top layer disposed at least partially above the first switching device;
a conductive ground layer disposed at least partially below the first switching device; and
a plurality of wirebond structures disposed between the first and second switching devices in the lateral space and electrically connected to the conductive top layer and conductive ground layer, the plurality of wirebond structures at least partially forming a radio frequency barrier between the first and second switching devices.

20. The wireless device of claim 19 wherein the RF module includes an amplifier device electrically connected to the first and second switching devices.

\* \* \* \* \*